(12) United States Patent
Sun et al.

(10) Patent No.: US 6,257,739 B1
(45) Date of Patent: Jul. 10, 2001

(54) SCANNING VERTICAL CAVITY SURFACE EMITTING LASER ARRAY CAPABLE OF PAGE-WIDTH IMAGE SCAN

(75) Inventors: Decai Sun, Sunnyvale, CA (US); Alex T. Tran, Ithaca, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/193,522

(22) Filed: Nov. 17, 1998

Related U.S. Application Data

(63) Continuation of application No. 09/173,329, filed on Oct. 15, 1998.
(60) Provisional application No. 60/069,674, filed on Dec. 12, 1997.

(51) Int. Cl.$^7$ .................................................. F21V 21/008
(52) U.S. Cl. ............................................. 362/285; 362/259
(58) Field of Search ................................... 362/259, 285, 362/287, 418, 427, 286; 372/50

(56) References Cited

U.S. PATENT DOCUMENTS

| | | | |
|---|---|---|---|
| 5,025,346 | 6/1991 | Tang et al. | 361/283 |
| 5,536,988 | 7/1996 | Zhang et al. | 310/309 |
| 5,628,917 | 5/1997 | MacDonald et al. | 216/2 |
| 5,640,133 | 6/1997 | MacDonald et al. | 333/197 |
| 5,719,891 | 2/1998 | Jewell | 372/45 |
| 5,747,366 | 5/1998 | Brillouet et al. | 438/44 |
| 5,764,671 | 6/1998 | Lebby et al. | 372/45 |

OTHER PUBLICATIONS

Judy, M. W. "Micromechanisms Using Sidewall Beams." PhD Dissertation Faculty of Electrical Engineering and Computer Sciences, University of California, Berkley, CA. 1994, pp. 1–215.

Legtenberg, R. et al. "Comb–drive actuators for large displacements." *J. Micromech. Microeng.* vol. 6, 1996, Printed in the UK, pp. 320–329.

Tang, W.C.; Nguyen, T.H.; Judy, M.W.; Howe, R.W. "Electrostatic–comb Drive of Lateral Polysilicon Resonators", *Transducers '89: Proceedings of the 5$^{th}$ International Conference on Solid–State Sensors and Actuators and Eurosensors III*, vol. 2, Jun., 1990, pp. 194–197.

Tang, W.C.; Nguyen, T.H.; Howe, R.T. "Laterally Driven Polysilicon Resonant Microstructures", *Proceedings IEEE Micro Electro Mechanical Systems*, Feb., 1989, pp. 187–193.

Zhang, Z.L.; MacDonald, N.C. "Fabrication of Submicron High–Aspect–Ratio GaAs Actuators", *Journal of Microelectromechanical Systems*, vol. 2, No. 3, Jun., 1993, pp. 66–73.

U.S. application No. 08/761,681, entitled "Raster Output Scanner with Pivotal Mirror for Process Direction Light Spot Position Control" filed on Dec. 6, 1996.

U.S. application No. 08/940,867, entitled "Highly Compact Vertical Cavity Surface Emitting Lasers" filed Sep. 30, 1997.

*Primary Examiner*—Y. Quach
(74) *Attorney, Agent, or Firm*—J. Krause-Pozstorfe; Linda M. Robb

(57) ABSTRACT

A micromachined movable shuttle is constructed in III–V material to allow in situ placement of VCSELs on the shuttle for a solid state image scanner in optical display and printing applications. A comb drive is used to actuate the shuttle for scanning purposes. Hundreds of VCSELs may be fabricated on a large movable shuttle.

15 Claims, 25 Drawing Sheets

SCANNING VERTICAL CAVITY SURFACE EMITTING LASER ARRAY CAPABLE OF PAGE-WIDTH IMAGE SCAN

CROSS-REFERENCE TO RELATED APPLICATIONS

The present application is a continuation of application Ser. No. 09/173,329, entitled "Monolithic Scanning Light Emitting Devices" filed Oct. 15, 1998, which claims priority to Provisional Patent Application, Serial Number 60/069,674, entitled "Monolithic Scanning VCSELs Using III–V Micromachining" filed on Dec. 12, 1997.

BACKGROUND OF INVENTION

The present invention relates generally to the field of optical imaging, and more particularly to optical scanning for high resolution, full width page scan, xerographic printing applications.

Xerographic exposure systems are important for printing. In xerographic printing, lasers or LEDS may be used to expose tiny dots on a photoreceptor surface. The photoreceptor has the property of holding an electrical charge in the absence of light. Illumination of a spot on the photoreceptor by a laser or LED causes the loss of charge at the exposed spot. In a typical xerographic system, charge left on the photoreceptor attracts toner that is then transferred to paper which has a greater charge than the photoreceptor.

Desirable features for xerographic exposure printing systems include full page-width printing, high resolution addressability, elimination of moving mechanical parts, and low power consumption. These features are important for achieving performance comparable to offset lithography and occupy a parameter space that lies beyond the speed and width capabilities of polygon raster output scanning (ROS) print engines. Polygon ROS printers typically consist of a laser light source, a polygon scanning beam deflector, an optical system of lenses and mirrors, a xerographic marking engine and the electronics to control the printer operation.

Solid state semiconductor light emitters are important devices in such diverse applications such as optoelectronic communication systems and high-speed printing systems. It is well-known in the proven art of silicon to provide suspension and actuation schemes, for example, comb drives using bending springs or parallel plate actuation using torsion springs. For optical beam steering applications, these silicon steering elements are typically combined with a light source in a separate package, or even with a light source 'glued' or bonded onto the silicon steering chip.

U.S. Pat. Nos. 5,536,988, 5,640,133, 5,025,346, "Fabrication of Submicron High-Aspect-Ratio GaAs Actuators" Zhang et al., Journal of Microelectromechanical Systems Vol. 2, No.2, p. 66–73, June 1993, "Laterally Driven Polysilicon Resonant Microstructuren" Tang et al., IEEE Micro Electro Mechanical Systems pp. 53–59, February 1989 (reprint), "Electrostatic-comb Drive of Lateral Polysilicon Resonators" Tang et al., Transducers '89, Proceedings of the 5th International Conference on Solid-State Sensors and Acutators and Eurosensors III, Vol. 2, pp. 328–331, June 1990 (reprint) and "Comb-drive actuators for large displacements", Legtenberg et al., Journal of Micromechanics and Microengineering, Vol. 6, pp.320–329, 1996 show the state of the art of micro-electromechanical systems (MEMS) actuators and methods of fabricating these devices. U.S. Pat. Nos. 5,747,366 and 5,719,891 show the state of the art of semiconductor light emitting assemblies.

U.S. patent application Ser. No. 08/761,681, entitled "Raster Output Scanner with Pivotal Mirror for Process Direction Light Spot Position Control" filed on Dec. 6, 1996 and assigned to the same assignee as the present invention teaches a MEMS torsional control device.

U.S. patent application Ser. No. 08/940,867, entitled "Highly compact Vertical Cavity Surface Emitting Lasers" filed on Sep. 30, 1997 and assigned to the same assignee as the present invention teaches the formation of highly compact and well-defined VCSELs.

All of the above references are hereby incorporated by reference.

SUMMARY OF INVENTION

In accordance with this invention, a solid state scanning imager is used to replace the polygon ROS used in optical display and printing applications. A VCSEL shuttle having a large movable stage carrying hundreds of scanning vertical cavity surface emitting lasers (VCSELs) is suspended by mechanical beams. Pairs of comb-drive structures are used to electrostatically actuate the movable stage. One set of comb-drive fingers (fixed fingers) is attached to the stationary mechanical beams while another set of comb-drive fingers (movable fingers) is attached to the movable stage. Alternating application of a bias voltage to selected fixed fingers causes the movable stage to travel back and forth in a scanning motion. The comb-drive structures need to possess enough flexibility to allow the movable stage to move sufficiently to allow scanning over half of the pitch of the VCSEL array.

The VCSEL shuttle is typically fabricated using III–V micromachining technology. This allows in situ manufacturing of III–V based light emitters which have highly desirable optical properties. For example, VCSELs can be made in the movable stage material as opposed to being attached separately. Undoped III–V material is used for the substrate for better enabling the electrical isolation of different parts of the VCSEL shuttle.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION OF THE INVENTION

Figure 1:
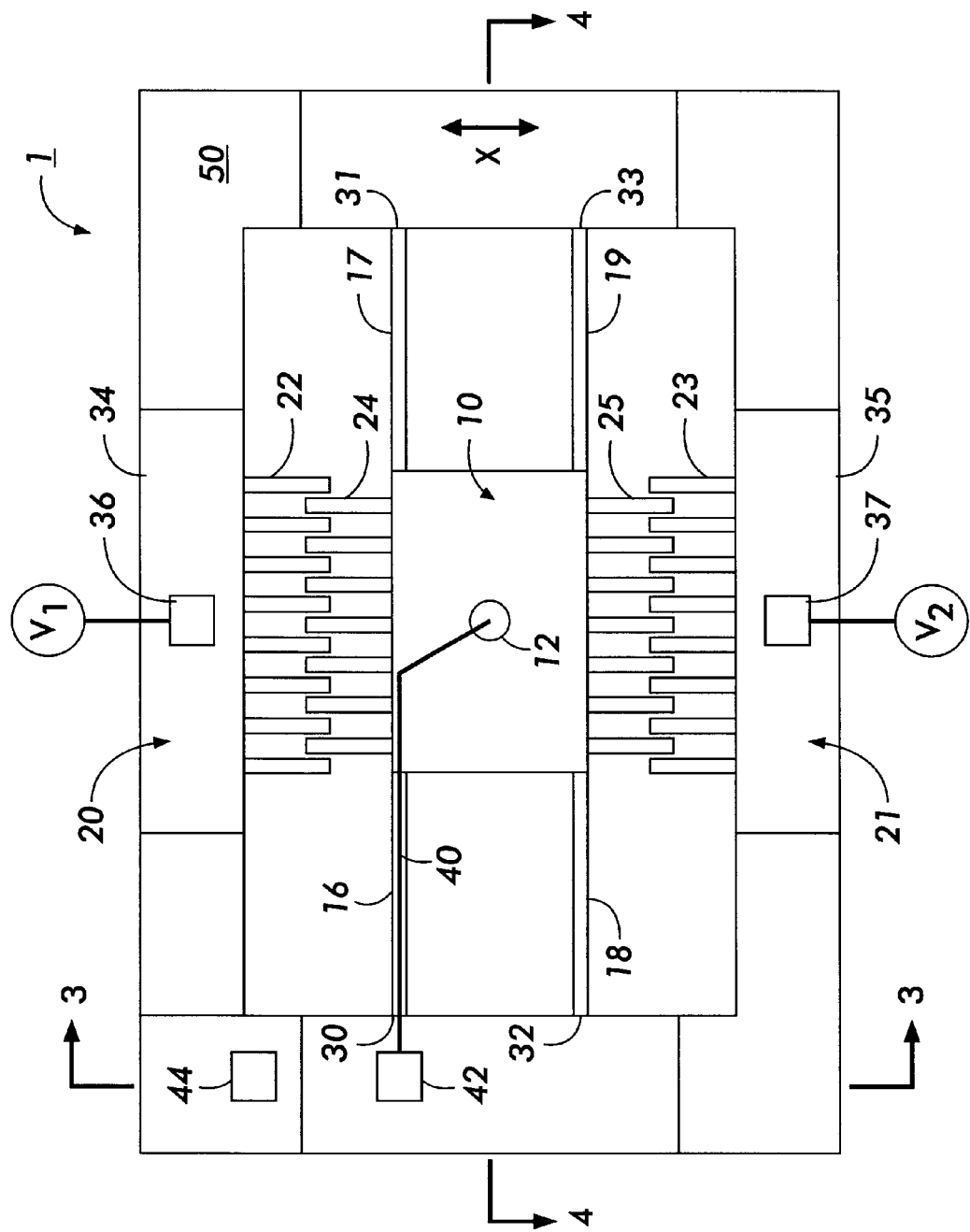
FIG. 1 shows a top view of a light emitting assembly movably supported on a semiconductor substrate.

FIG. 1 is a top view of a micromachined movable stage with a light emitter, actuation mechanism and suspension system. The light emitter preferably takes the form of any III–V based emitters, for example, vertical cavity surface emitting lasers (VCSELs), light emitting diodes (LEDS), and edge emitting light emitters. In the particular embodiment shown in FIG. 1, VCSEL shuttle 1 has movable VCSEL stage 10 which supports VCSEL 12. Stage 10 has one mechanical degree of freedom (x) and is suspended with springs 16–19. Springs 16–19 may take the form of straight bending springs (as shown), and may also include other configurations known from the silicon art, for example, folded beams. Mechanical designs such as 'folded spring' suspensions, tapered or stepped comb fingers, x/y folded spring suspensions, archimedian spiral springs for a rotational degree of freedom, etc., which are well-known in silicon structures, may be implemented in the III–V structures. The in-plane shape of structures (stage, springs, combs) is relatively arbitrary within fairly wide limits.

Movement of stage 10 is actuated with electrostatic comb drives 20 and 21, all anchored to substrate 50. Electrostatic comb drives may be replaced with any actuation system as is well known in the microelectromechanical systems (MEMS) art, for example, magnetic, thermal and piezoelectric systems. As shown, stage 10 is moved by applying voltage V1 between fixed fingers 22 and movable fingers 24 of comb drive 20 and applying a voltage V2 between fixed fingers 23 and movable fingers 25 of comb drive 21.

Electrostatic forces cause movable fingers 24 and 25 of comb drives 20 and 21 to 'pull in' to minimize the energy stored in the system. Movable fingers 24 and 25 are attached to stage 10 with its integrated VCSEL 12 and stage 10 is suspended with flexible springs 16–19. Springs 16–19 are anchored to substrate 50 at anchor points 30—33, while fixed combs 22 and 23 are anchored to substrate 50 at anchor points 34 and 35. In a first order approximation, the stage position is proportional to the force, which is proportional to the square of the applied voltage. Conductive heat transfer through the suspension springs sinks the waste heat from the VCSEL into the substrate. The low threshold current, characteristic for VCSELs, makes it possible to keep the temperature of the stage under control.

An important metallization /contacting issue is how to get the electrical connections for the VCSEL(s) 12 onto the mechanically suspended stage 10. In the embodiment shown, conductive line 40 is run from contact pad 42 on substrate 50 to stage 10 and to VCSEL 12. Conductive line 40 runs over the neutral fiber of suspension spring 18, and is electrically isolated from suspension spring 18. The 'neutral fiber' is the stress free centerline of the flexing spring. The width of conductive line 40 is chosen sufficiently small relative to the width of the spring and runs along the centerline of the spring in order to minimize mechanical stress, which allows conductive line 40 to survive the mechanical scanning motion of the beam. The electrical isolation of conductive line 40 from suspension spring 18 may be accomplished in many ways, for example, with a dielectric layer underneath conductive line 40 or insulating the suspension beam surface using shallow ion implantation.

Figure 2:
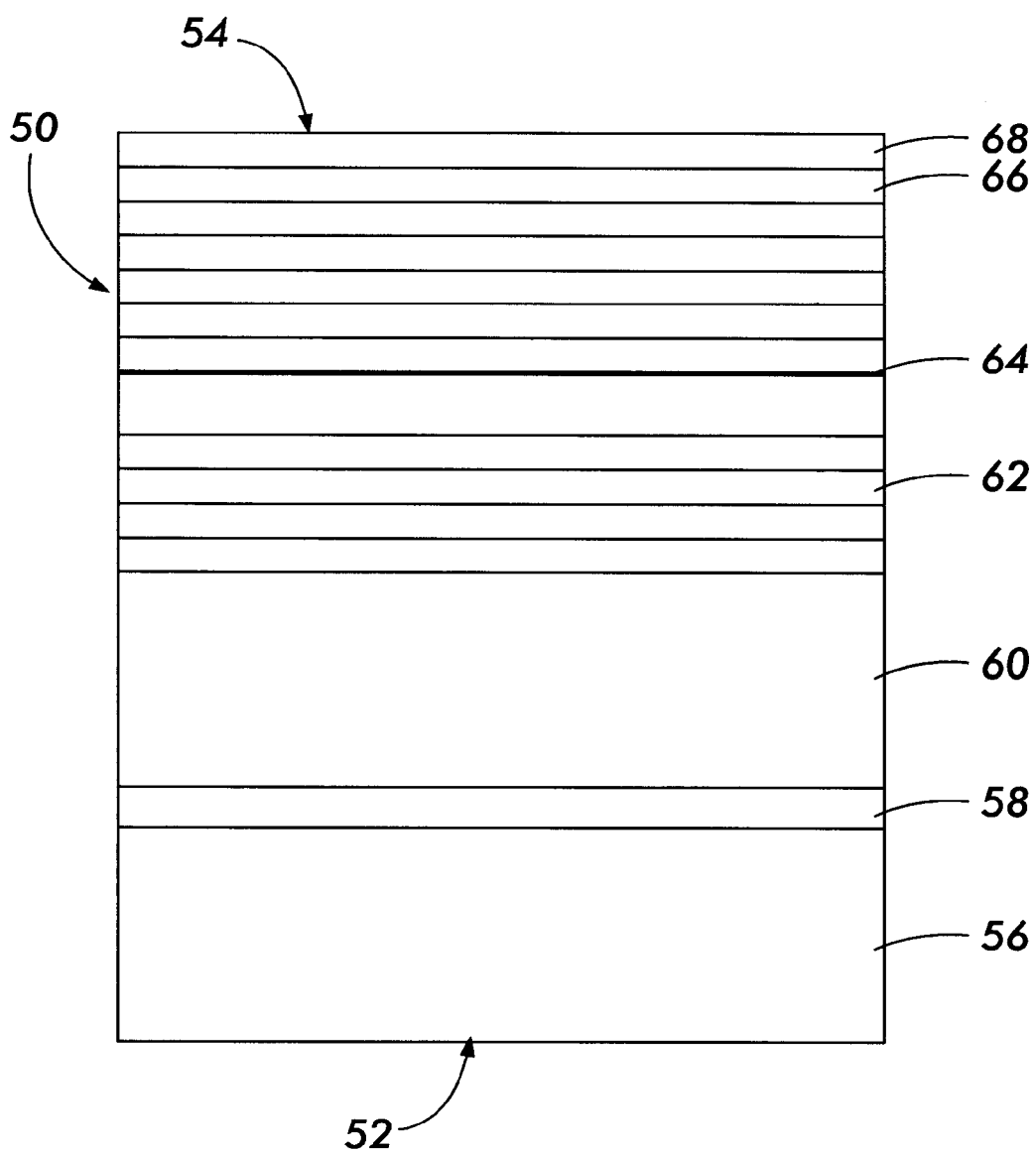
FIG. 2 shows the cross-section of the semiconductor substrate in FIG. 1 prior any processing.

FIG. 2 is a cross-sectional view of substrate 50 having a VCSEL structure prior to any etching with substrate back side 52 and substrate front side 54. In this embodiment, the VCSEL structure includes layers of undoped III–V substrate 56, etch stop layer 58, GaAs buffer layer 60, N-type quarter wave distributed Bragg reflector (DBR) mirror layers 62, active region 64, P-type DBR mirror 66 and P+ contact layer 68. In a preferred embodiment layer 56 is an undoped GaAs substrate, etch stop layer 58 is AlAs, buffer layer 60 is N-GaAs, n-DBR layer 62 is n-$Al_xGa_{1-x}As/Al_yGa_{1-y}As$, active layer 64 is a quantum well layer sandwiched by AlGaAs potential confinement layers, P DBR layer is P–$Al_xGa_{1-x}As(x\sim0.05)/Al_yGa_{1-y}As$ (y~0.95) and P+ contact layer is GaAs.

The VCSEL structure may be formed using any well-known etching processes to form the VCSEL cavity. The semiconductor laser structure then undergoes ion implantation process for isolation and metallization. Holes flows through the p-DBR region confined by the ion implanted area and into that portion of the active layer which lies below the p-DBR cavity and recombine with electrons flowing upwards from the N-DBR below and producing photon emission and optical amplification. At sufficiently high current flow, this optical amplification in combination with feedback from the DBR mirrors will result in laser oscillation and emission within the VCSEL cavity. Regions formed by the ion implantation isolation process are highly resistive.

Figure 3:
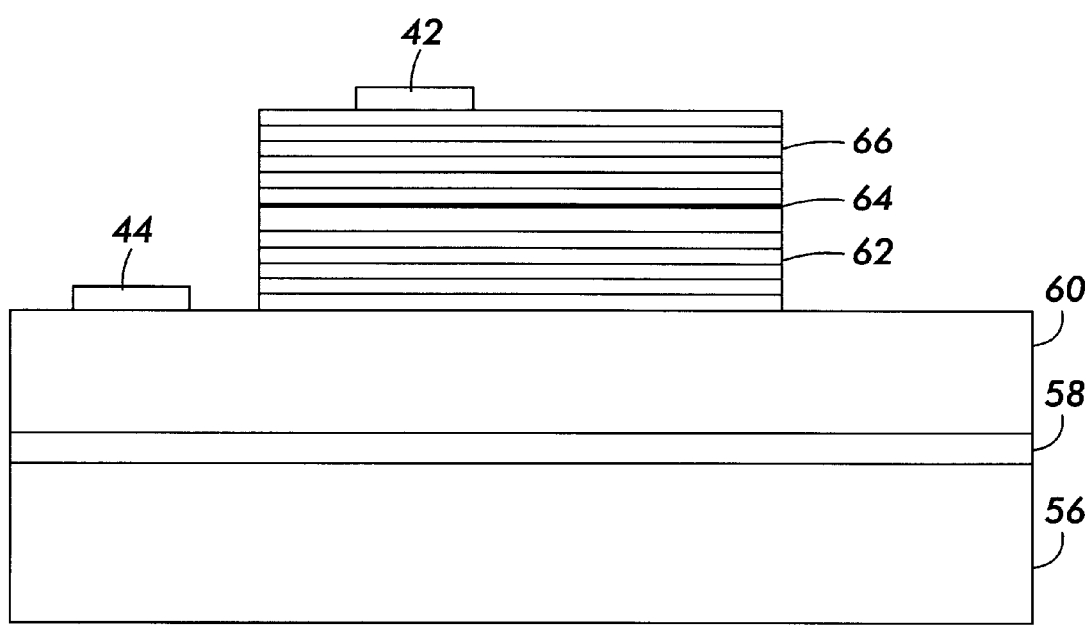
FIG. 3 shows a cross-sectional view of the light emitting assembly in FIG. 1 along line 3—3.

FIG. 3 is a cross sectional view along line 3—3 of FIG. 1, and shows the VCSEL structure described in FIG. 2 after the VCSEL structure has been processed or etched. VCSEL anode 42 has been deposited on top of the VCSEL 12 (not shown) and ground 44 has been deposited on buffer layer 60. The region under VCSEL anode 42 is ion implanted for electrical isolation to direct current flow into the active region of the VCSEL.

Figure 4:
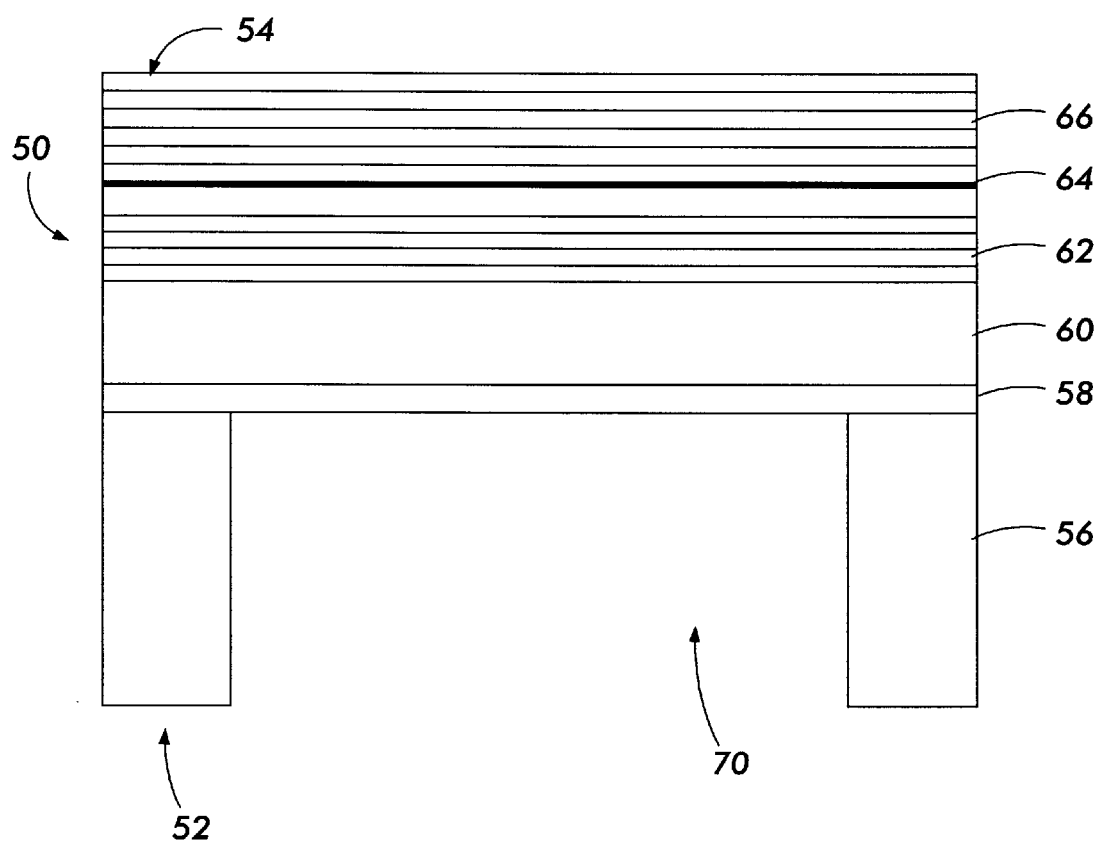
FIGS. 4 and 5 show a cross-sectional view of the movable light emitting assembly along line 4—4 of FIG. 1 using an RIE/RIE fabrication process.
Figure 5:
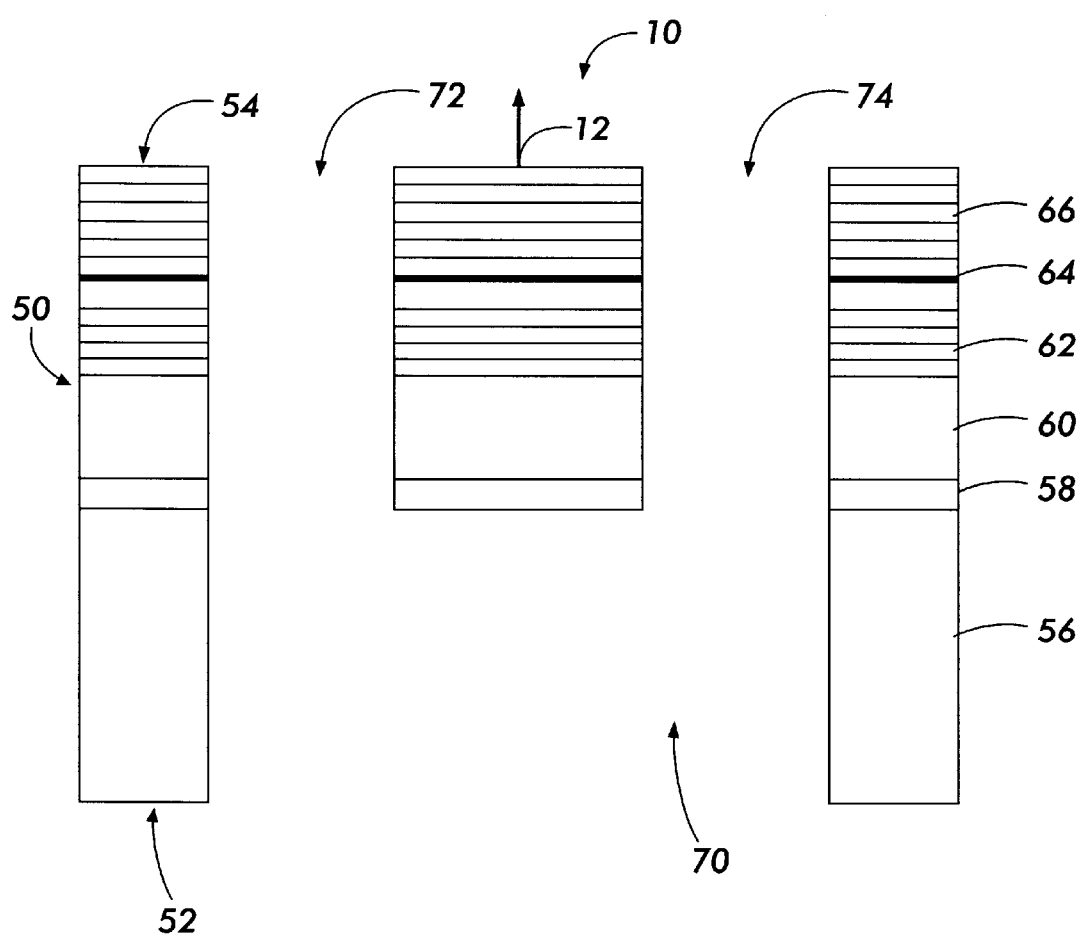

FIG. 4 is a cross-sectional view of VCSEL shuttle 1 taken along line 4—4 of FIG. 1 prior to the shuttle release etch step in which an RIE/RIE process has been used. A deep reactive ion etch from the substrate back side 52 to layer 58 is used to produce a III–V membrane with a thickness equal to the desired thickness of the stage 10, springs 16–19 and combs 20 and 21. The III–V membrane forms a bridge structure between unetched substrate portions of substrate 50 with layer 56 having substrate etched portion 70. In a second RIE step shown in FIG. 5, from substrate front side 54, the III–V membrane is perforated in the shape of stage 10, springs 16–19 (not shown) and combs 20 and 21 (not shown) with membrane etched portions 72 and 74. This step releases the unanchored structures from substrate 50 and makes them movable. The anchor points are defined in the areas where the front side etch intersects the sidewalls of the backside etch. The two etches can be post processing steps, performed after the regular VCSEL process.

Figure 6:
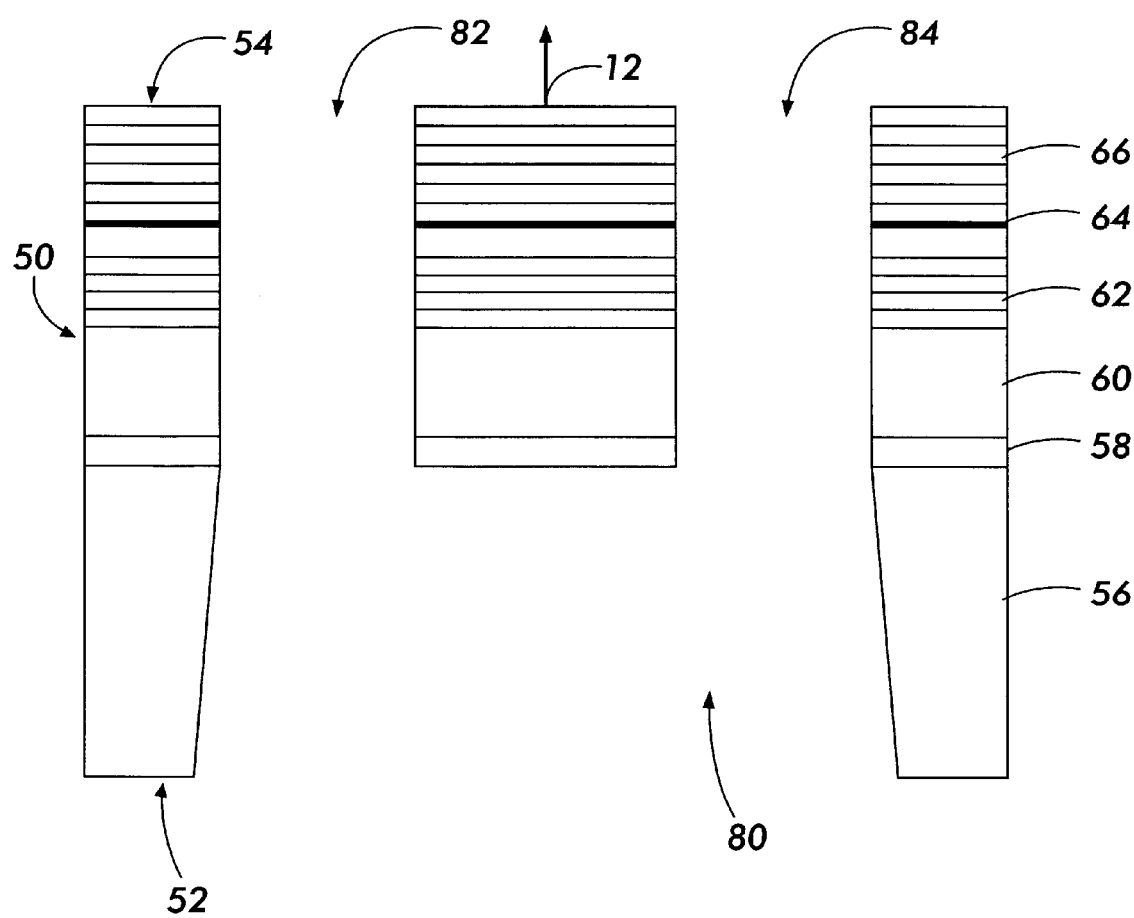
FIG. 6 shows a cross-sectional view of the movable light emitting assembly along line 4—4 of FIG. 1 in using ODE/RIE fabrication process;.

FIG. 6 is a cross-sectional view of VCSEL shuttle 1 taken along line 4—4 of FIG. 1 in which an isotropic wet etch process has been used. This process is used on the substrate back side 52 to produce the III–V membrane supported by unetched layer 56 with etched portion 80. The front side 54 etch is still RIE to form etched portions 82 and 84. In this approach, the wet etch step on the back side can be done before the VCSEL process, leaving the front side of the wafer unaffected. After the regular VCSEL process, the additional RIE step from the front side would again release the moving parts.

Figure 7:
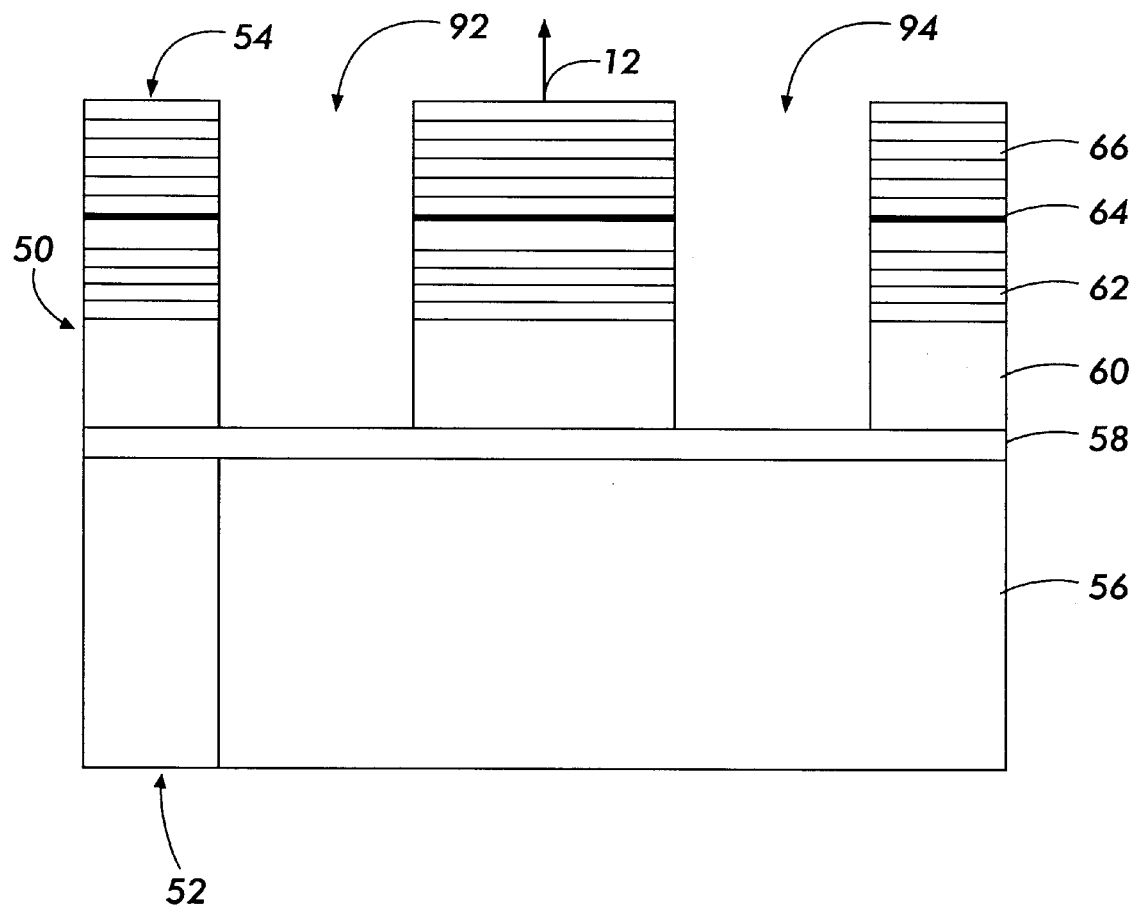
FIGS. 7 and 8 show a cross-sectional view of the movable light emitting assembly along line 4—4 of FIG. 1 using an RIE and sacrificial layer fabrication process.
Figure 8:
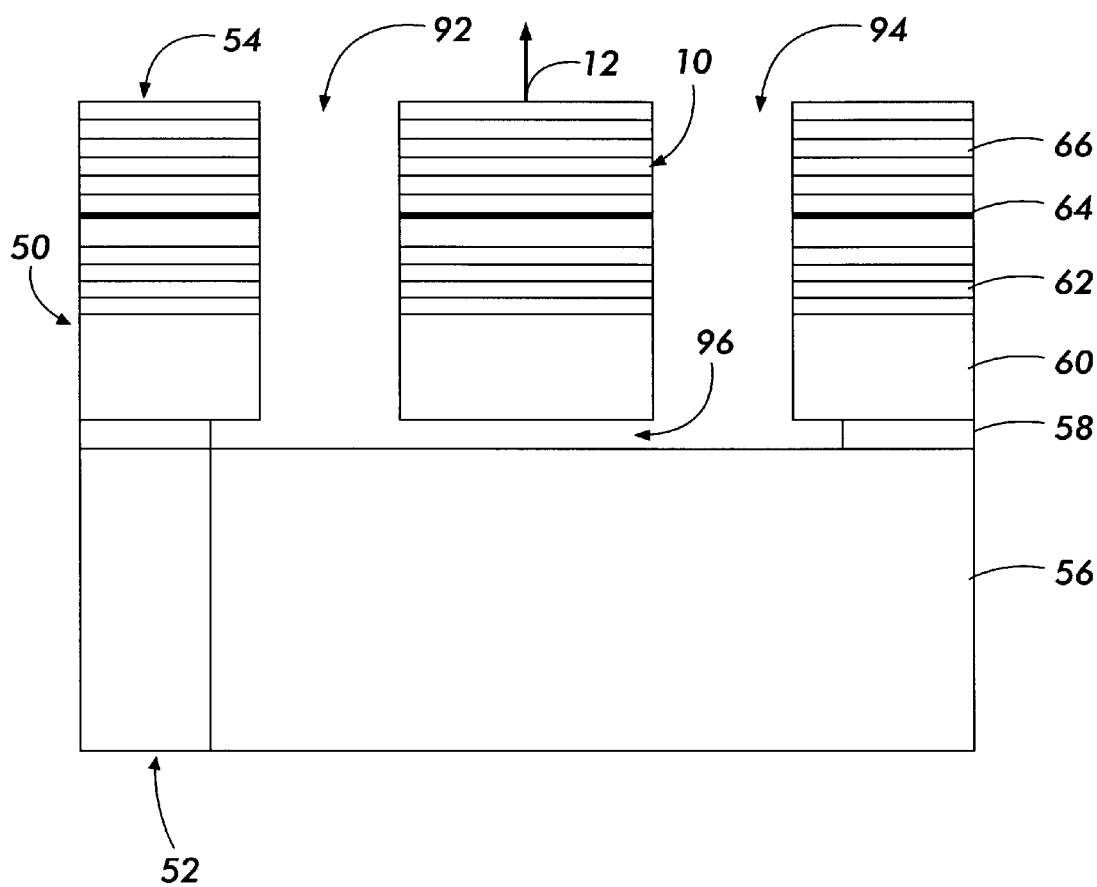

FIG. 7 is a cross-sectional view of VCSEL shuttle taken along line 4—4 of FIG. 1 which uses a 'sacrificial layer' fabrication process. This process is based on an RIE step after the VCSEL process, defining the stage, combs and springs, and with etched portions 92 and 94 exposing etch stop layer 58. FIG. 8 shows an underlying portion of etch stop layer 58 which is subsequently etched away ('sacrificed') from underneath the membrane forming etched portion 96. This releases the moving parts from substrate 50. The sacrificial etch is typically done with a wet etchant which etches the sacrificial layer material but does not etch the top layer material.

Figure 9:
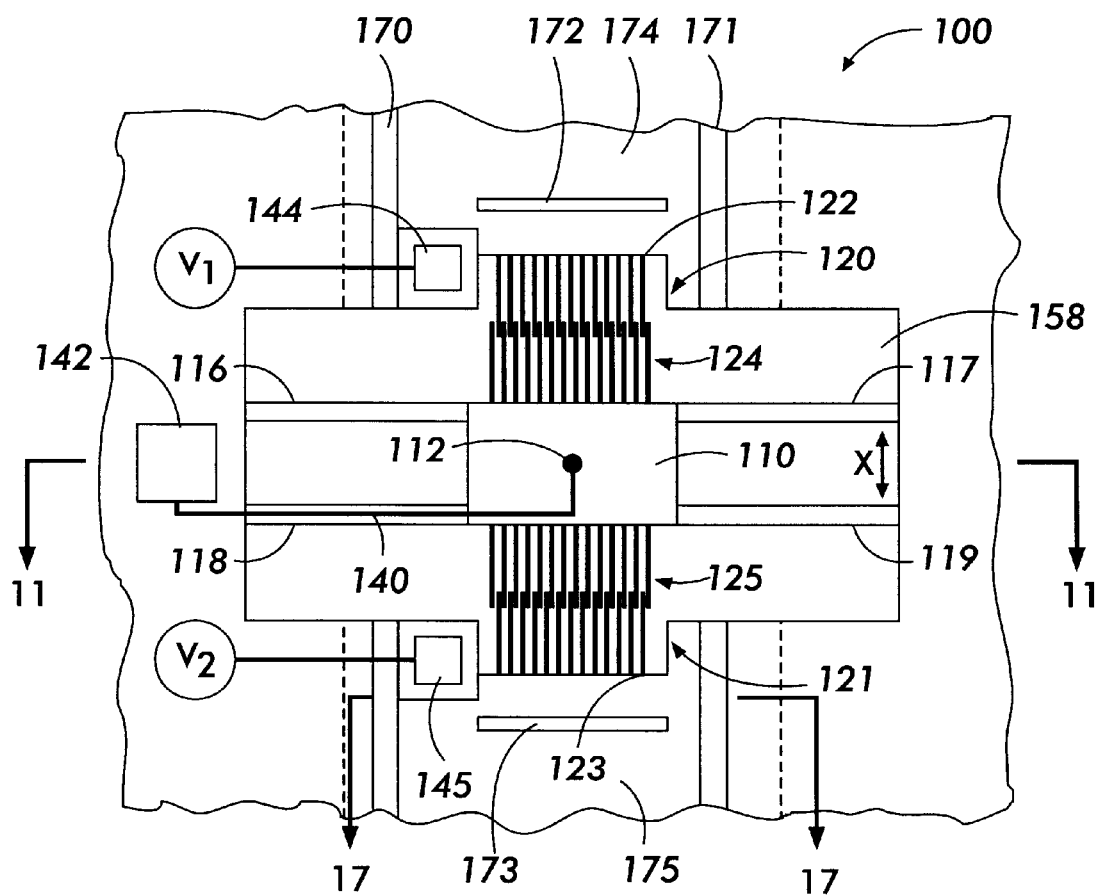
FIG. 9 shows a top view of a light emitting assembly movably supported on a doped semiconductor substrate.

FIG. 9 shows a top view of VCSEL shuttle 100 which provides for electrical isolation of comb fixed fingers 122 and comb movable fingers 124 of comb drive 120 and comb fixed fingers 123 and comb movable fingers 125 of comb drive 121. Since the fingers of each comb are of opposite polarities coupled by capacitance only, electrical isolation is needed which has to stand over 100 V electrical bias without breakdown. In one embodiment, this is realized by oxidizing layer 158 of about 500 to 1000 nm thick underneath the VCSEL structure, combined with etched isolation grooves 170 and 171 etching down to the oxidized layer. The oxidation of the AlAs layer is done through oxidation grooves 172 and 173 etched in the middle of the regions to be oxidized.

Figure 10:
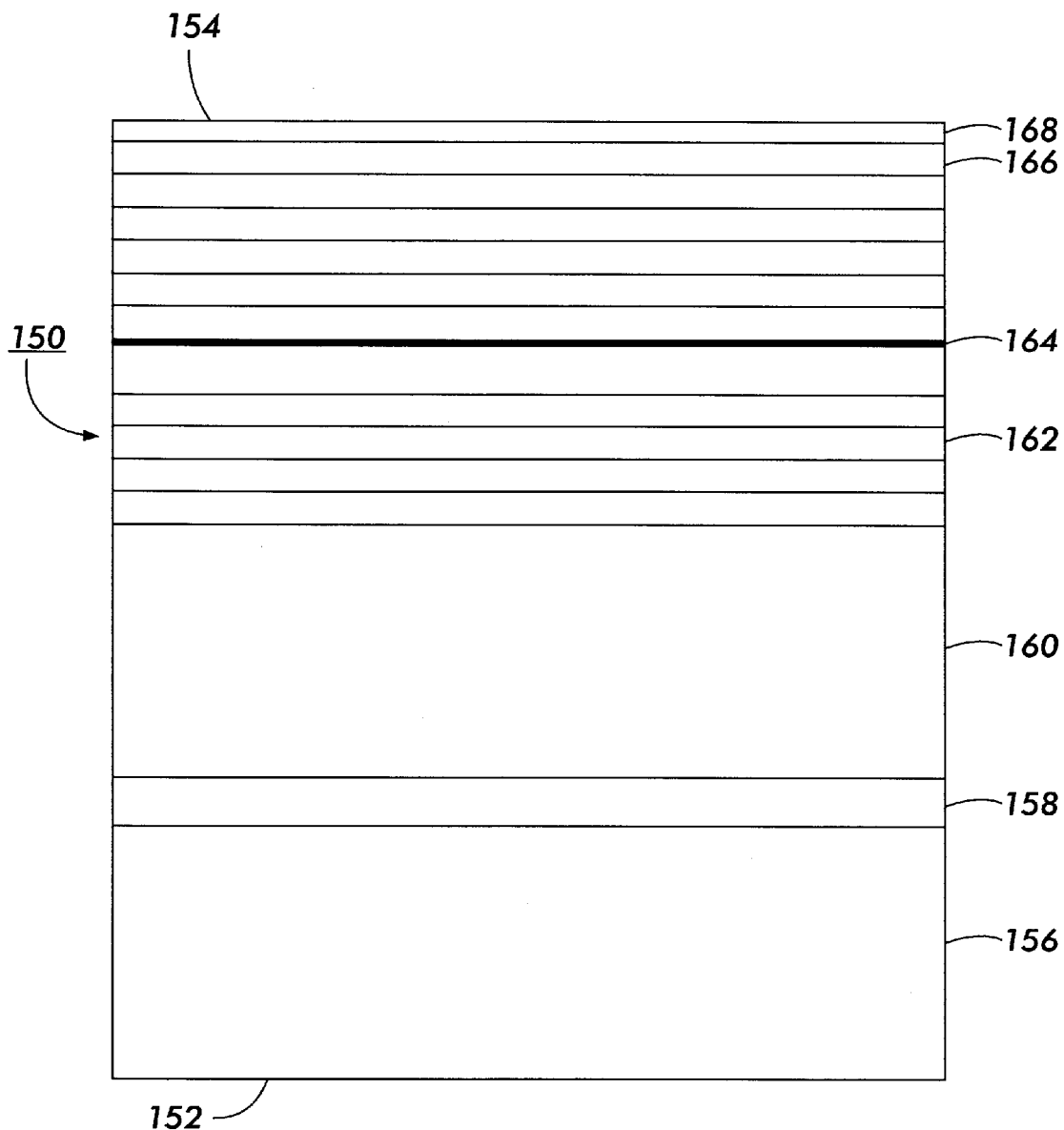
FIG. 10 shows the cross-section of the semiconductor substrate in FIG. 1 prior to any processing.

FIG. 10 is a cross-sectional view of substrate 150 having a VCSEL structure prior to any processing with substrate back side 152 and substrate front side 154. VCSEL structure includes layers of doped III–V substrate 156, etch stop layer 158, buffer layer 160, quarter wave distributed Bragg reflector (DBR) mirror layers 162, active region 164, PDBR mirror 166 and P+contact layer 168.

Figure 11:
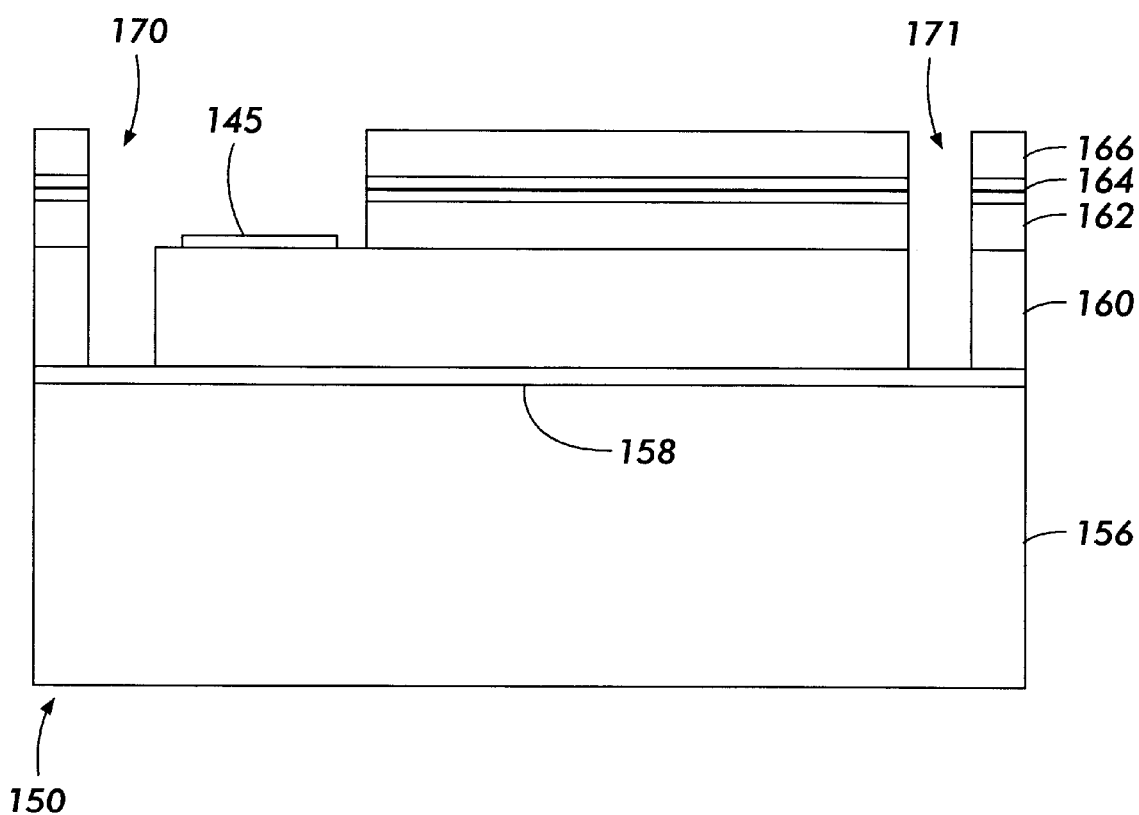
FIG. 11 shows a cross-sectional view of the light emitting assembly in FIG. 9 along line 11—11.

FIG. 11 is a cross-sectional view of the fixed comb drive region along line 11—11 shown in FIG. 9. The $AlO_x$ layer 158 extends to the tips of static fingers 123. Electrical contact pad 145 for comb drive fixed fingers 123 is deposited on top of nGaAs buffer layer 160, so that the n-DBR layers 162 and the n-GaAs buffer layer 160 above the $AlO_x$ layer 158 can couple the electrical static force between finger sets 123 and 125. Comb movable fingers 125 are connected to the electrical ground 142 of VCSEL 112,so that no separate electrical contact is needed, which simplifies the fabrication process. When a bias is applied by $V_1$ between the comb drive fingers 122 and 124, VCSEL shuttle 100 is scanned in a linear motion as indicated by the x arrow and when a bias is applied by $V_2$ between comb drive fingers 123 and 125, VCSEL shuttle 100 is scanned in the opposite direction.

Figure 12:
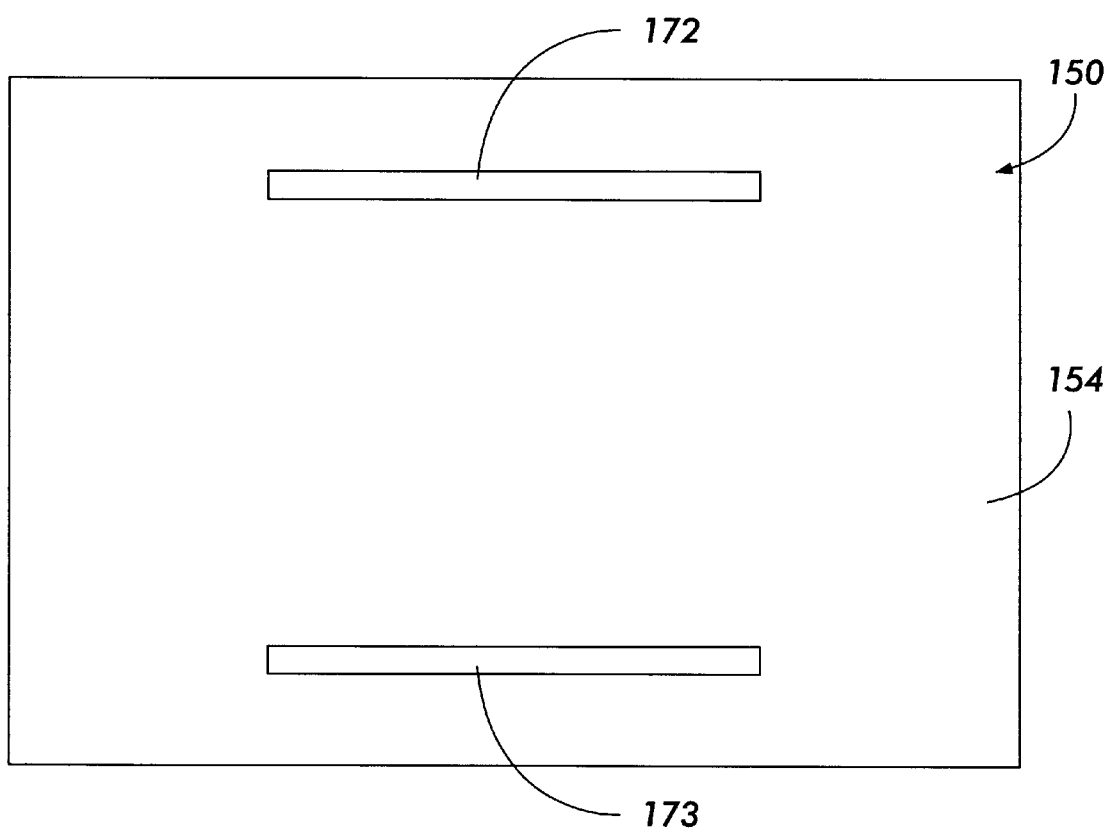
FIGS. 12–18 show top views of the processing steps used in fabricating the light emitting assembly in FIG. 9.

The VCSEL shuttle shown in FIG. 9 may be produced by many different processes, for example a process using the following steps:

FIG. 12 shows a top view of substrate 150 with oxidation grooves 172 and 173 etched from the front side 154 of layered substrate to reach the AlAs layer 158 beneath the n-GaAs buffer layer.

Figure 13:
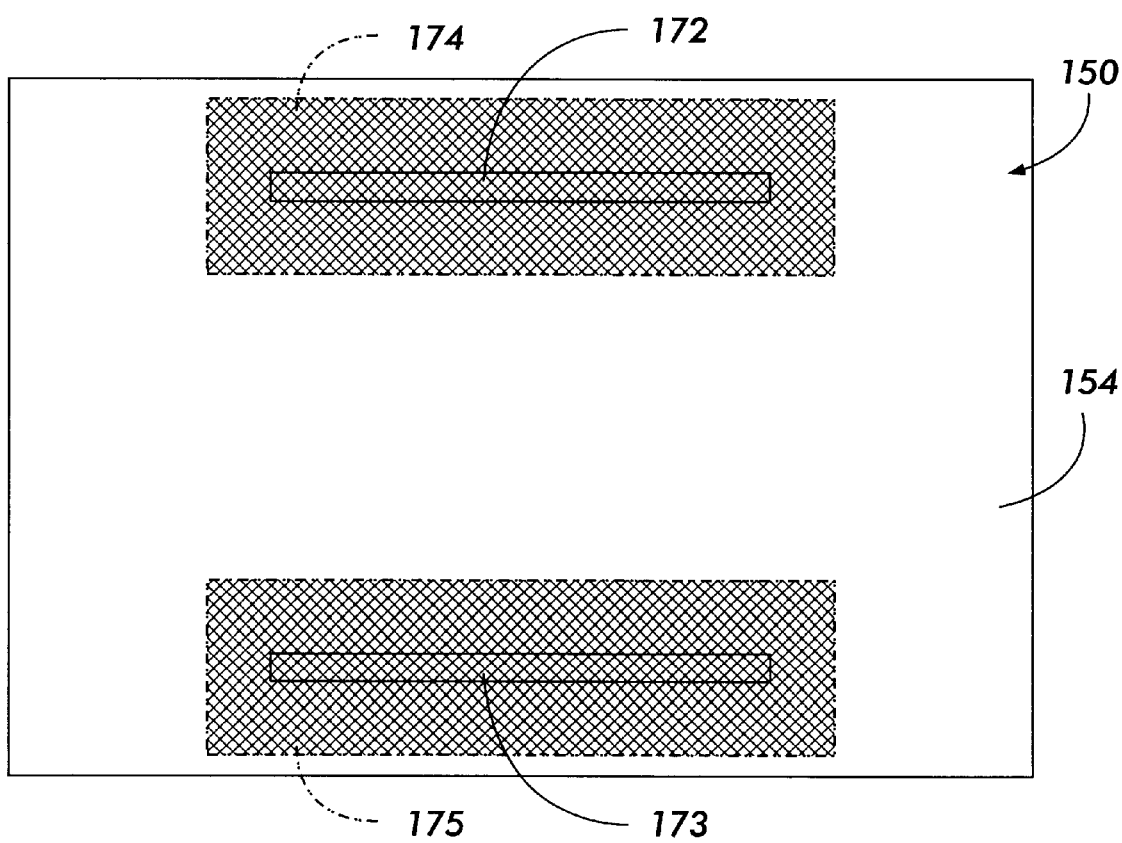

FIG. 13 shows the next step which includes oxidation of the AlAs layer to an $AlO_x$ layer to cover desired areas 174 and 175, for example, 200 um by 200 um. The oxidation area may be controlled by timing the length of the oxidation process.

Figure 14:
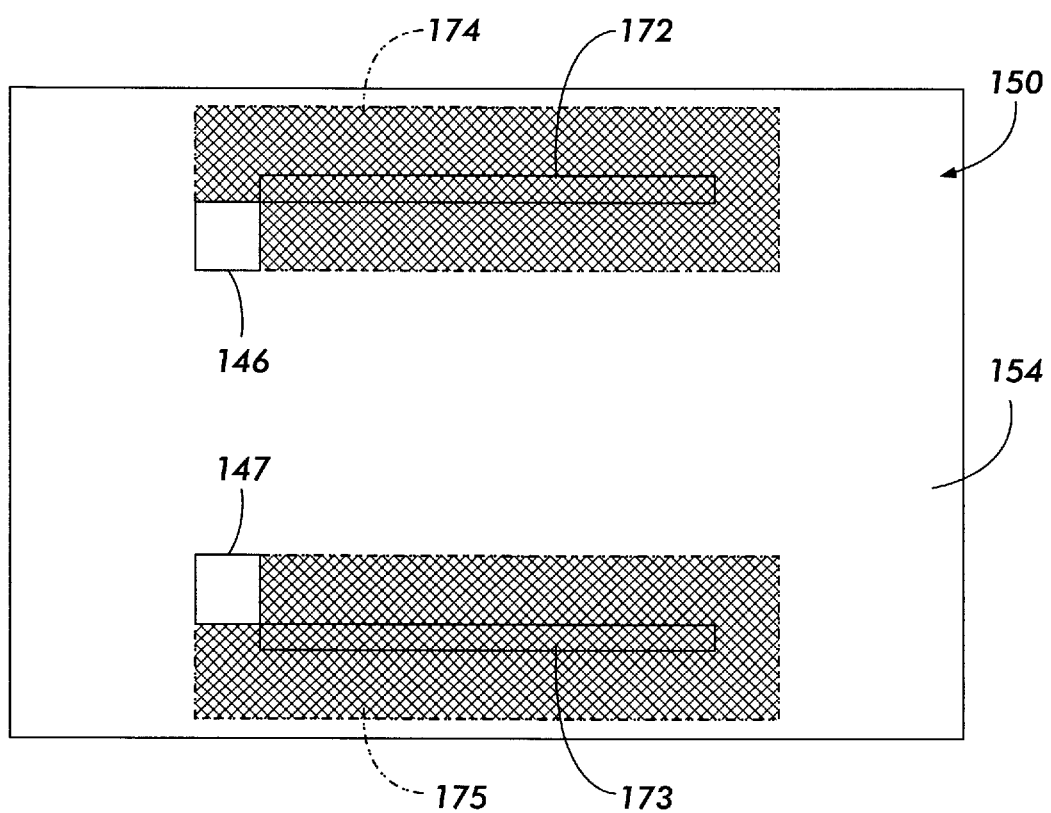

FIG. 14 shows the steps of patterning and etching to buffer layer 160 at contact areas 146 and 147 in preparation for the deposition of electrical contacts 144 and 145 for fixed comb drives.

Figure 15:
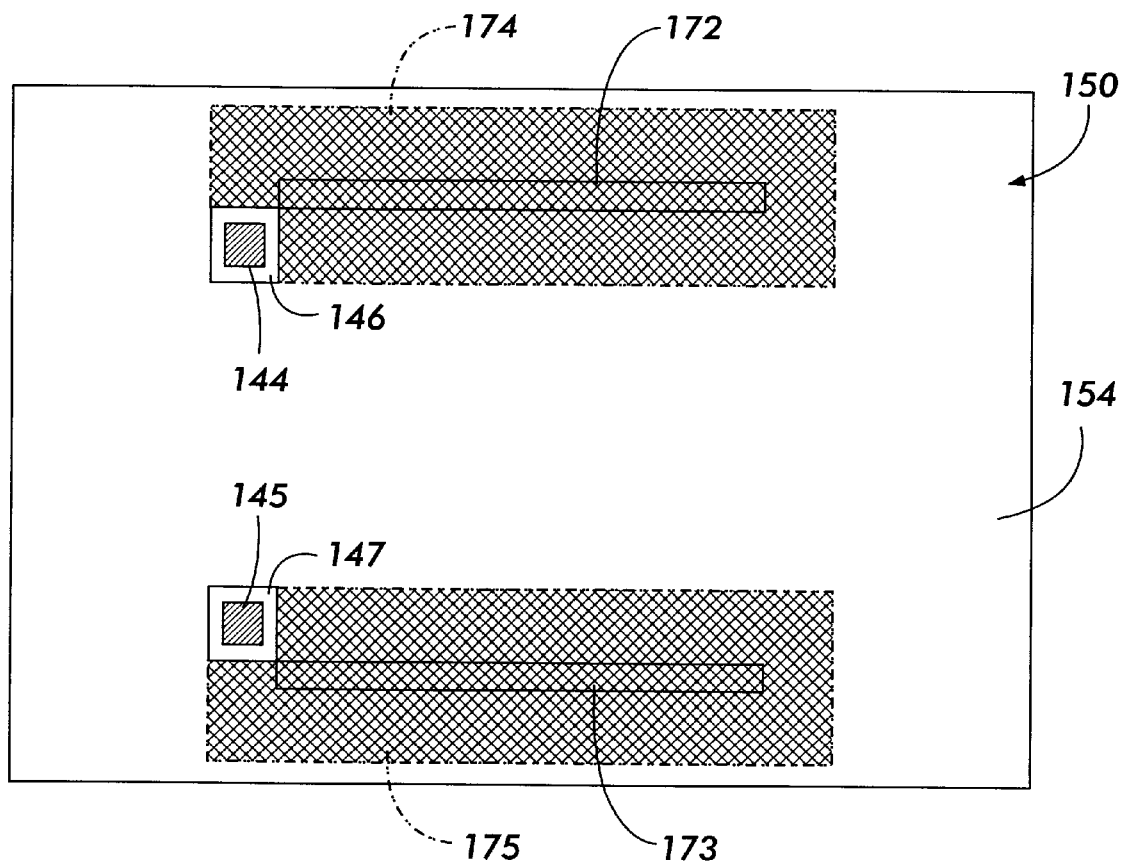

FIG. 15 shows the deposition of electrical contacts 144 and 145 onto exposed buffer layer 160.

Figure 16:
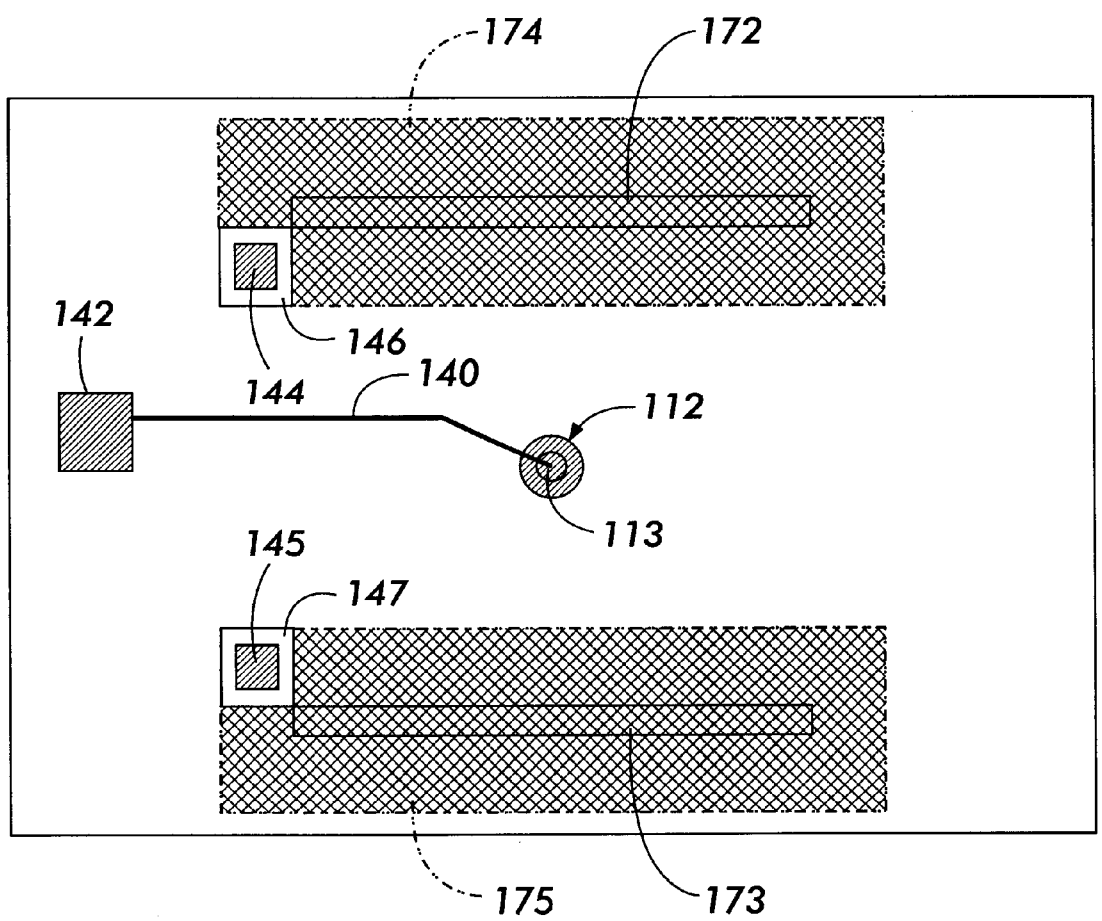

FIG. 16 shows the next step in which VCSEL 112 is fabricated with conductive line 140 connected to VCSEL contact pad 142. VCSEL 112 has VCSEL cavity 113 formed by an ion implantation process isolation process.

Figure 17:
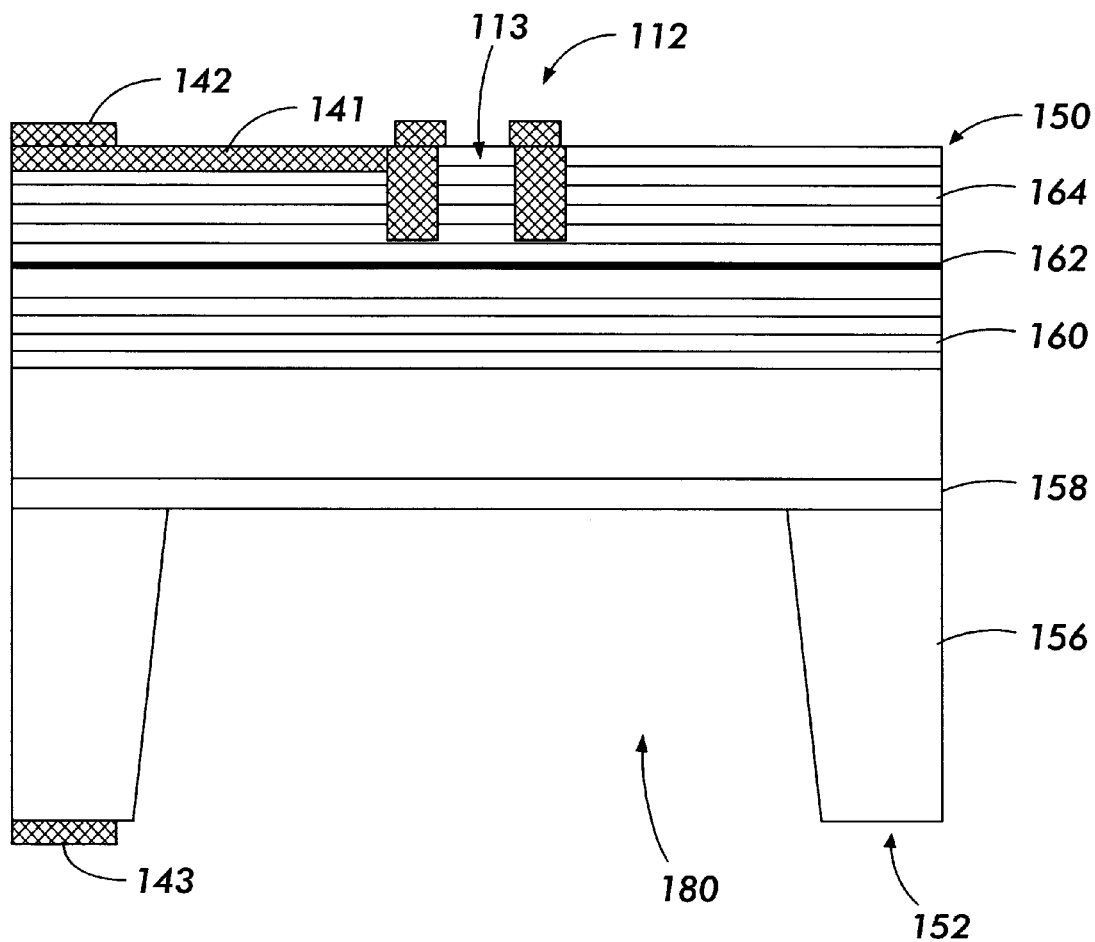

FIG. 17 shows a cross-sectional view along line 17—17 of FIG. 9 with the stage and electrostatic combs not yet etched. This figure shows the step of patterning the back 152 of substrate 150 to open a hole 180 using, for example, a spray etcher. The spray etchant of $H_2O_2$ and $NH_4OH$ mix may be used. As the pH of the mixed solution is over 6, the etchant becomes selective of GaAs over oxidation layer 158 so the etching will stop at the oxidation layer 158. Deep dry etching may be used to remove the substrate. Implantation region 141 extends underneath conductive line 140 and is insulating so that the current can only flow into the active region of the VCSEL from pad 142). Electrical contact 143 is deposited on the comer of the substrate back side 152.

Figure 18:
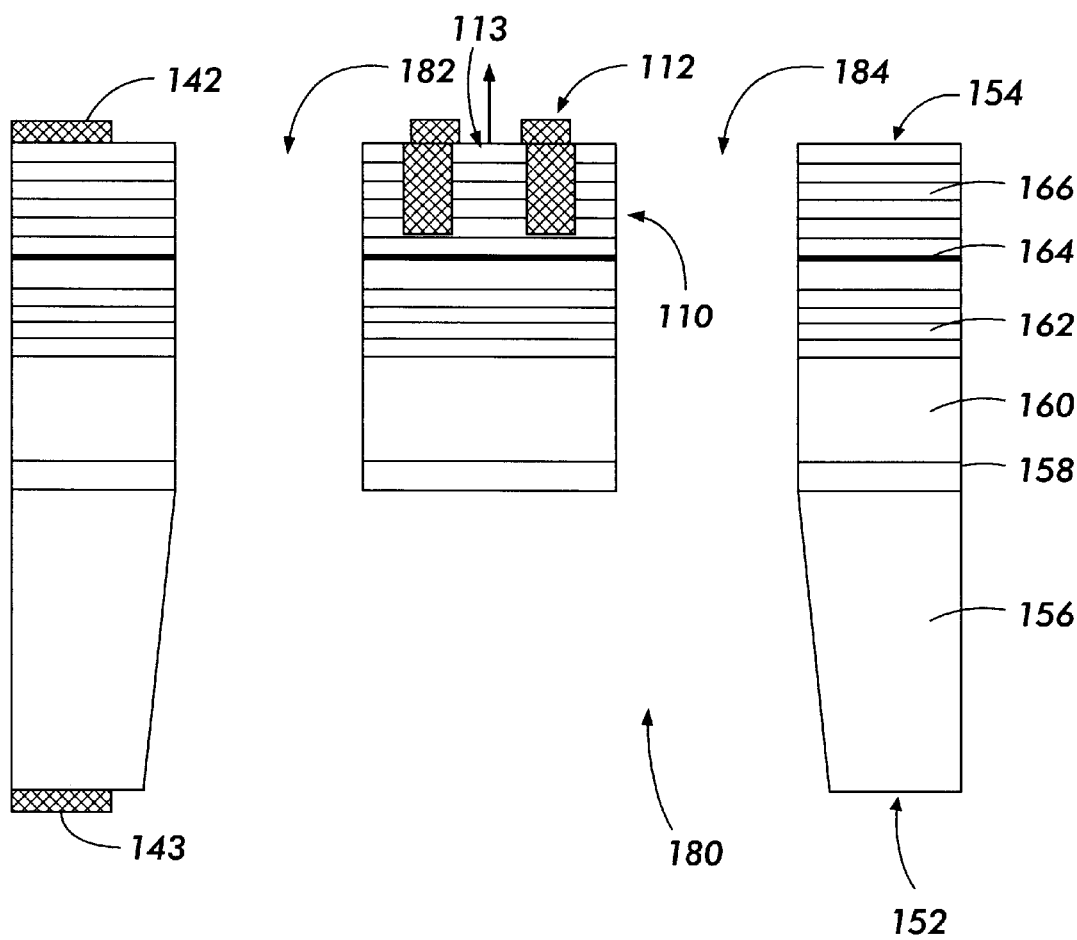

The last step is shown in FIG. 18 where patterning and etching substrate front side 154 to define finger (not shown) and shuttle features including stage 110. Preferably the etching is done with a high aspect ratio dry etching process to form the electrostatic combs. Stage 110 is attached to substrate 150 by suspension beams 116, 117, 118 and 119 as shown in FIG. 9.

The current of VCSEL 112 flows through the n-GaAs layer in the long suspended beam 118 to the n-GaAs substrate 160. To estimate the series resistance of a 30 $\mu$m wide and 450 $\mu$m long beam with a 10 $\mu$m thick n-GaAs buffer layer 60, with doping density of $5\times18/cm^3$ and the electron mobility of 1000 $cm^2$/Vs, the resistance per beam is about 19 ohms. Considering two beams in parallel connection, the total electrical resistance is 9.5 ohms. Comparing to the series resistance of the VCSEL which is about 200 ohms typically, the added series resistance from the long suspended beam is quite small.

Since there is built-in compressive strain in the VCSEL structure due to lattice mismatch between AlGaAs and GaAs, the stage may buckle after release from the GaAs substrate. Increasing the thickness of the GaAs buffer layer will not only reduce the series resistance of the VCSEL, but will also increase the mechanical stability of the shuttle stage. Another approach to prevent the stage from buckling is depositing a layer in tensile strain on top of the stage to compensate for the built-in compressive stress. Tensile strained dielectric layers such as $SiN_x$ or $SiO_2$ may be used to accomplish this.

Figure 19:
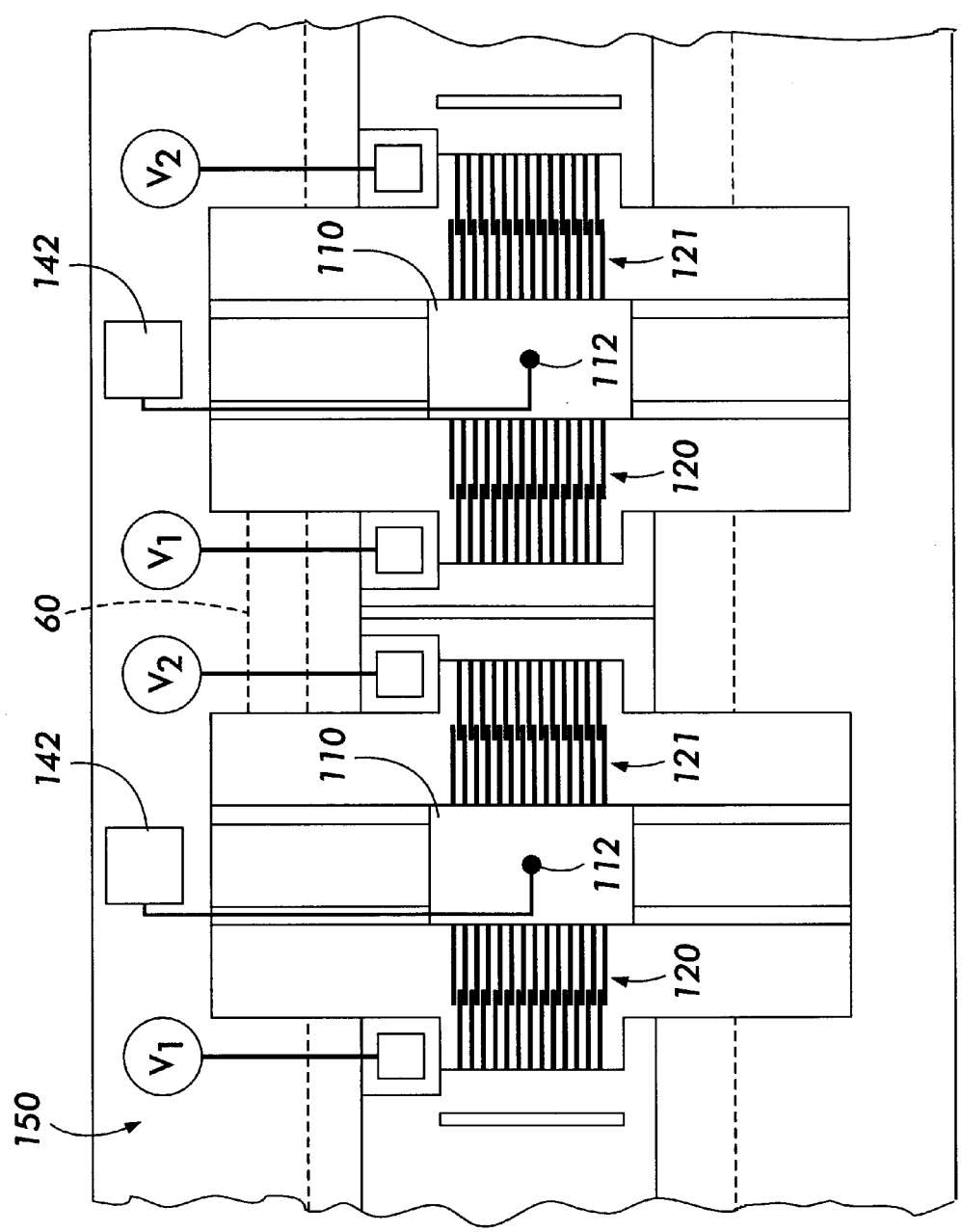
FIG. 19 shows a top view of a 1 by 2 light emitting assembly array using a plurality of the light emitting assembly in FIG. 9.

FIG. 19 shows a 1×2 scanning VCSEL array using the VCSEL structure described in FIG. 9. This paftem of multiple VCSELs can be repeated to make large linear or two-dimensional arrays. The numbers in FIG. 19 refer to the same structures as those described in FIG. 9.

The VCSEL scanners can be packaged in TO-type packages (e.g. 1 VCSEL per package, or more if desirable) with built-in short focal length lens. A 'small' stage scan length (e.g. 5 $\mu$m) can, within limits, be considerably magnified by placing the VCSEL scanner close to a short focal length lens and using a comparatively large throw distance (e.g. 1" optical scan length feasible for a 50 $\mu$m mechanical scan amplitude using a 10 inch or 20 inch throw distance (250×, 125×respectively).

Figure 20:
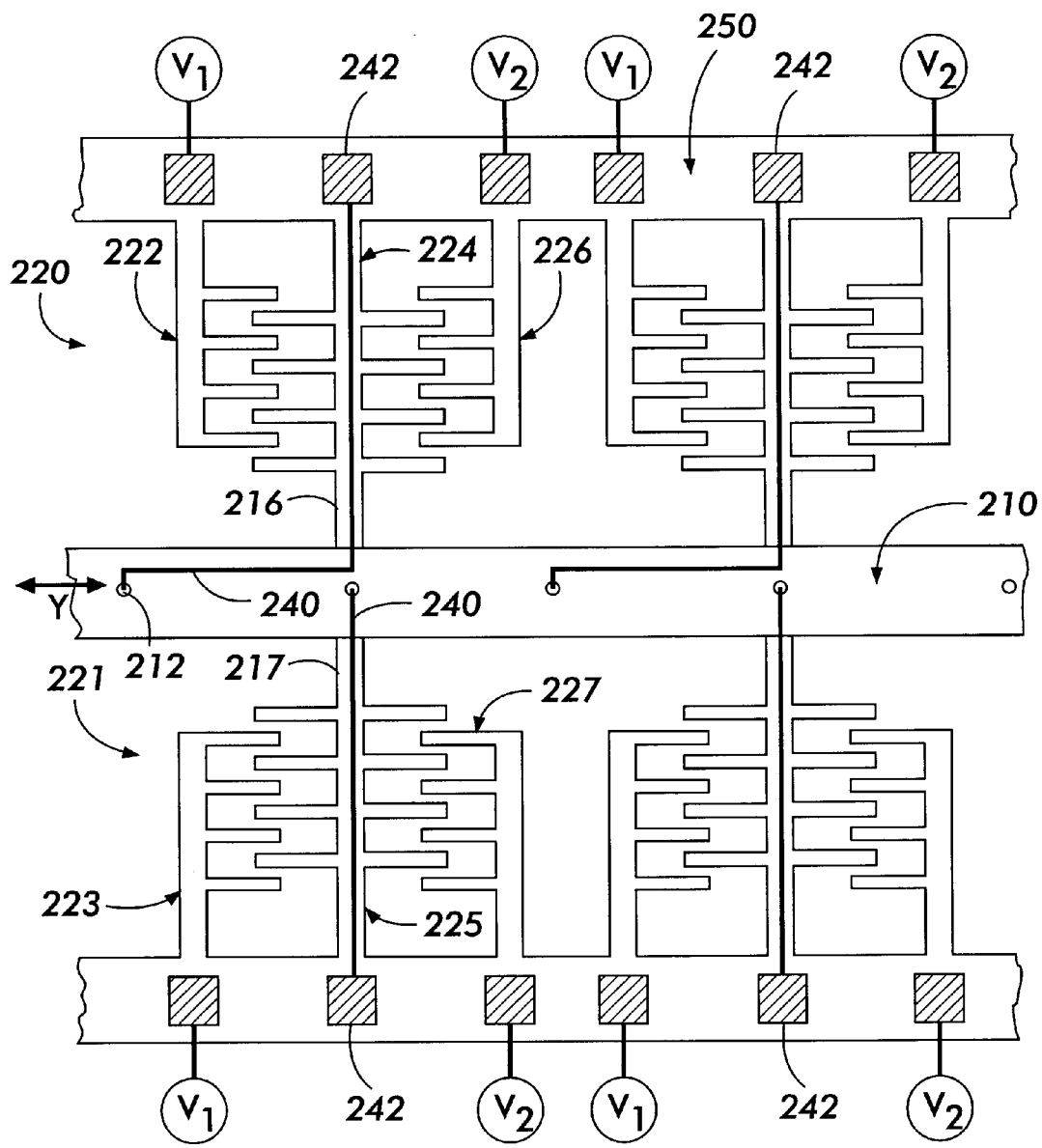
FIG. 20 shows a top view of a light emitting assembly array with a plurality of light sources.

FIG. 20 shows a segment of a III–V VCSEL scanning array with scanning stage 210 carrying multiple VCSELs 212. Only one set of comb actuators 220 and 221 will be described, however, as shown, multiple sets of combs are used to move stage 210. Comb actuator 220 includes fixed finger sets 222 and 226 and movable finger set 224 while comb actuator 221 includes fixed finger sets 223 and 227 and movable finger set 225. Movable finger sets 224 and 225 support stage 210 with suspension beams 216 and 217. Fixed finger sets 222, 226 and 223, 227 are attached to substrate 250. Voltages $V_1$ and $V_2$ supply fixed finger sets 222 and 223 with the power to actuate the comb drives 220 and 221 in the y direction shown. Each VCSEL 212 has conductive line 240 which runs from VCSEL contact pad 242 on substrate 250 over movable finger sets 224, 225 along suspension beams 216 and 217 to supply the VCSEL electrical connection. The pitch of VCSEL arrays is on the order of a hundred microns. The resonant scanning frequency is on the order of tens of kilohertz, with a displacement of over tens of micrometers. When combined with a projection optical system of seven (7) times magnification, the VCSEL array of 4 cm width is capable of covering a page width scan of 12 inches.

Figure 21:
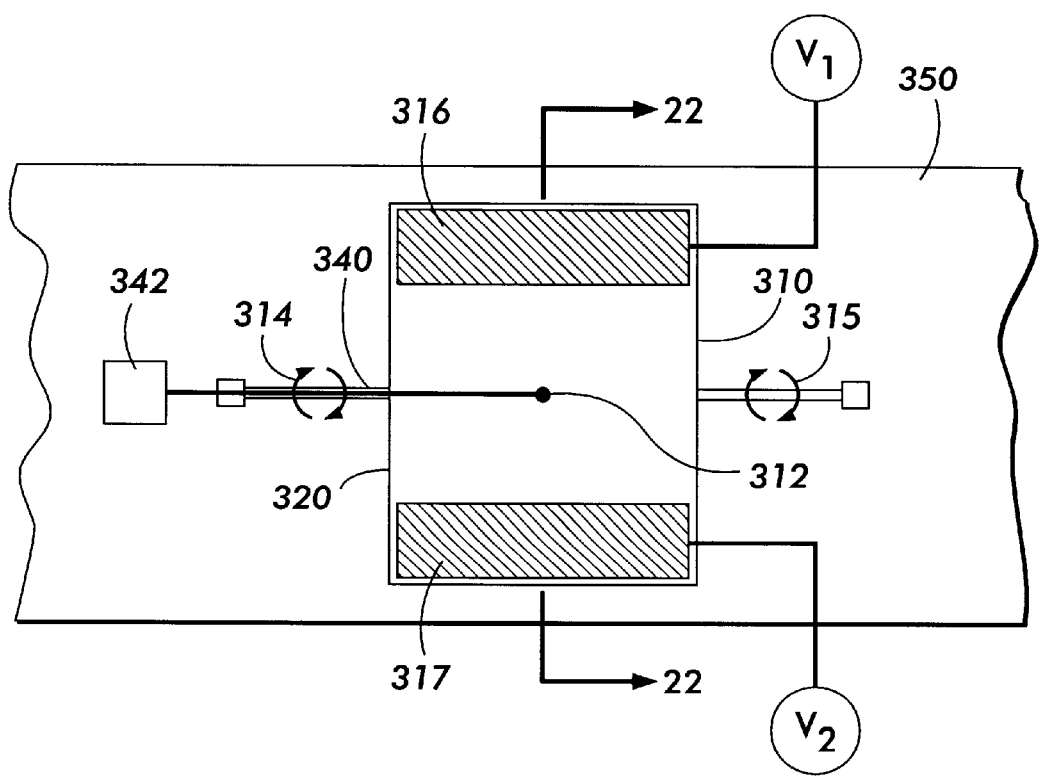
FIG. 21 shows a top view of an electrode actuated movable light emitting assembly supported on a substrate.
Figure 22:
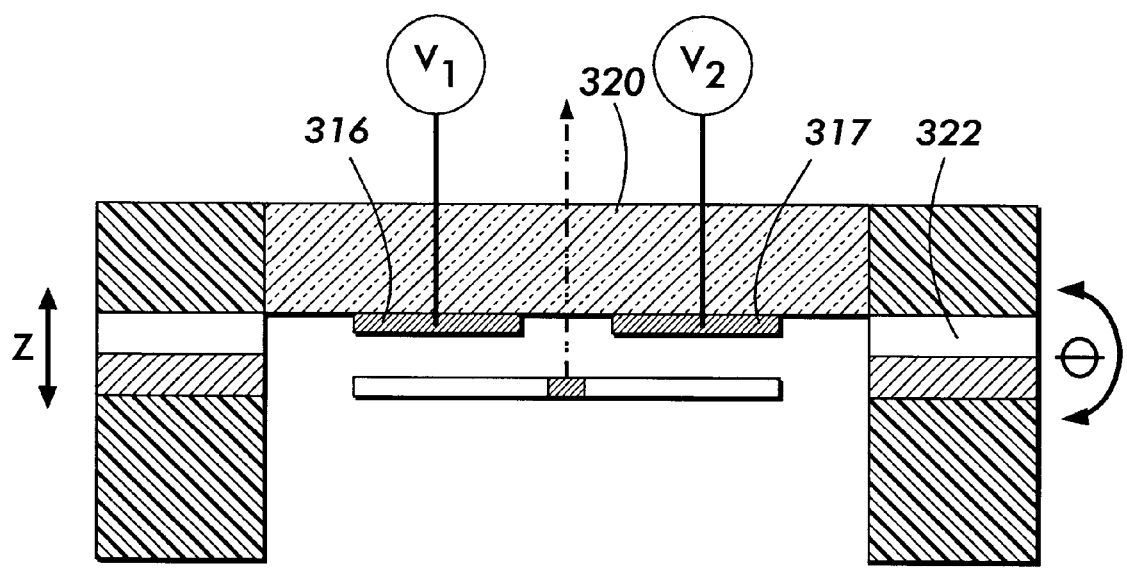
FIG. 22 shows a cross-sectional view of the electrode actuated movable light emitting assembly along line 22—22 of FIG. 21.

FIG. 21 shows a z-, or Θ-degree of freedom of VCSEL motion. VCSEL 312 is supported on stage 310. The micromachined semiconductor substrate 350 has VCSEL 312 on stage 310 suspended from suspension springs 314 and 315. The actuation is done with parallel plate capacitors formed between stage 310 and electrodes 316 and 317 on glass cover 320. "Raster Output Scanner with Pivotal Mirror for Process Direction Light Spot Position Control", U.S. patent application Ser. No. 08/761,681, filed on Dec. 6, 1996 cited earlier discloses the manufacture and operation of a pivoting mirror, the operation of moving stage 310 being similar in operation to that of the pivoting mirror. Differential actuation of electrodes 316 and 317 produces a Θ motion; common actuation of electrodes 316 and 317 produces a z-motion. The dimensions and geometry of the suspension springs can be optimized to either favor a Θ or z-degree of freedom. Conductive line 340 electrically connects VCSEL 312 with contact pad 342. FIG. 22 is a cross-sectional view of FIG. 21, along line 22—22. Glass cover 320 is supported above substrate 350 by seal 322.

Figure 23:
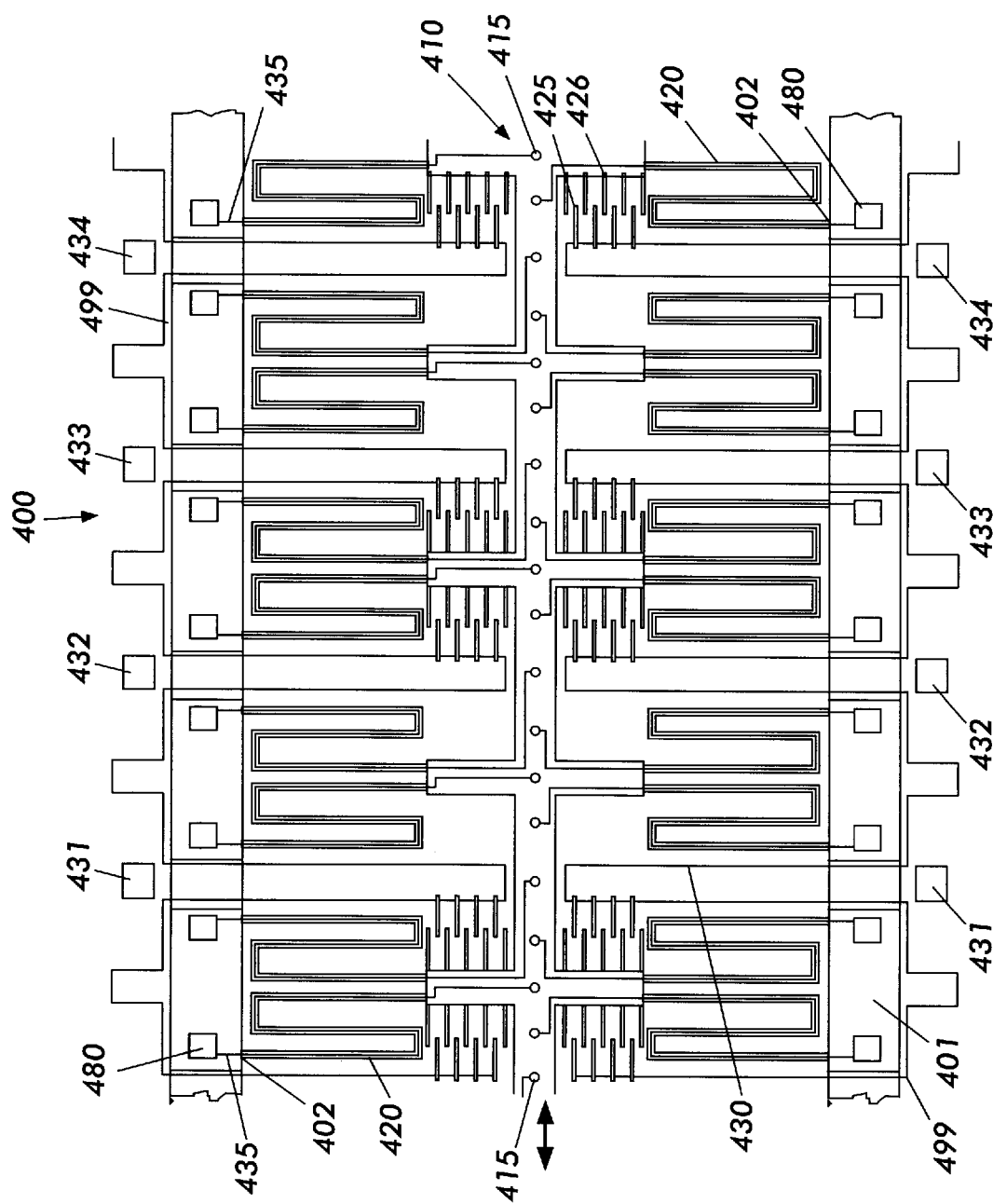
FIG. 23 shows a top view of a light emitting assembly array suspended using folded beams in accordance with an embodiment of this invention.

An embodiment of a scanning VCSEL shuttle in accordance with the present invention is shown in FIG. 23. VCSEL shuttle 400 has a large movable stage 410 carrying several hundred VCSELs 415 that is suspended by folded mechanical beams 420 to allow for a large scan range, driven by electrostatic actuation using comb drive fingers 425 and 426.

Folded beams 420 are anchored to substrate 401 at anchor points 402. Electrostatic comb drives may be replaced with other actuation systems as is well-known in the MEMS art, for example, magnetic, thermal and piezoelectric systems.

Pairs of comb drive fingers 425 and 426 are used to provide the electrostatic driving force. Fixed fingers 425 are attached to rigid stationary beam 430 while movable fingers 426 are attached to movable stage 410. When a bias voltage is applied to odd numbered electrodes 431, 433, and the other odd numbered electrodes not shown, movable stage 410 is pulled to the right in FIG. 23. When a bias voltage is applied to even numbered electrodes 432, 434, and the other even numbered electrodes not shown, movable stage 410 is pulled to the left in FIG. 23. Movable stage 410 is made to scan back and forth by alternating the voltage bias between the odd numbered electrodes such as electrodes 431 and 433 and the even numbered electrodes such as electrodes 432 and 434. The dimensions of comb drive fingers 425 and 426 and folded beams 420 are chosen so that the maximum scan range is greater than half of the pitch of VCSELs 415 on movable stage 410. For example, if the pitch of VCSELs 415 is 60 $\mu$m, the maximum scan range needs to be at least 30 $\mu$m.

In accordance with an embodiment of this invention, folded mechanical beams 420 are used as shown in FIG. 23 because the folded beam approach gives a much larger scan range than a straight clamped-clamped beam of the same length. The layers making up folded beams 420 are the same as the layers making up clamped-clamped beams 216 and 217 in FIG. 20. A folded beam flexure design for the same material composition reduces the development of axial forces and possesses a much larger linear deflection range. Folded mechanical beams 420 also function to allow conductive heat transfer from VCSELs 415 into substrate 401.

Electrical connections to VCSELs 415 are established via conductive lines 435 which run from contact pads 480 on substrate 401 to movable stage 410 in accordance with an embodiment of this invention. Conductive lines 435 run over and are electrically isolated from the neutral fiber of folded beams 420 to VCSELs 415. The 'neutral fiber' is the stress free centerline of folded beams 420. Conductive lines 435 are chosen sufficiently small relative to the width of folded beams 420 and run along the stress free centerlines of folded beams 420 to allow conductive lines 435 to survive the flexing of folded beams 420. Typical thickness for conductive lines 435 is 2 $\mu$m. The electrical isolation of conductive lines 435 from folded beams 420 may be accomplished in many ways, for example, with a dielectric layer underneath conductive lines 435 or insulating the surface of folded beams 420 using shallow ion implantation.

Folded beams 420 establish the return current flow from VCSELs 415 which reside at electrical ground. Return current flows through the active region of VCSEL 415 to n-DBR layer 62 (e.g., see FIG. 2) to n-GaAs buffer layer in the lower part of folded beam 420, to undoped GaAs substrate 401 and out to ground.

FIG. 20 shows clamped-clamped beams 216 and 217. The deflection of clamped-clamped beams 216 and 217 only obeys linear deflection theory up to a quarter of beam thickness, H. In contrast, folded beam flexure has the same beam stiffness ratio as the clamped-clamped beam flexure while obeying linear deflection theory up to approximately 10% of beam length, L. The beam stiffness ratio, $s_r$ is defined as:

$$s_r = k_x/k_y \quad (1)$$

where $k_x$ and $k_y$ are the spring constants of a suspension beam along the x and y axis, respectively. The y axis is taken to be in the scan direction.

Figure 24:
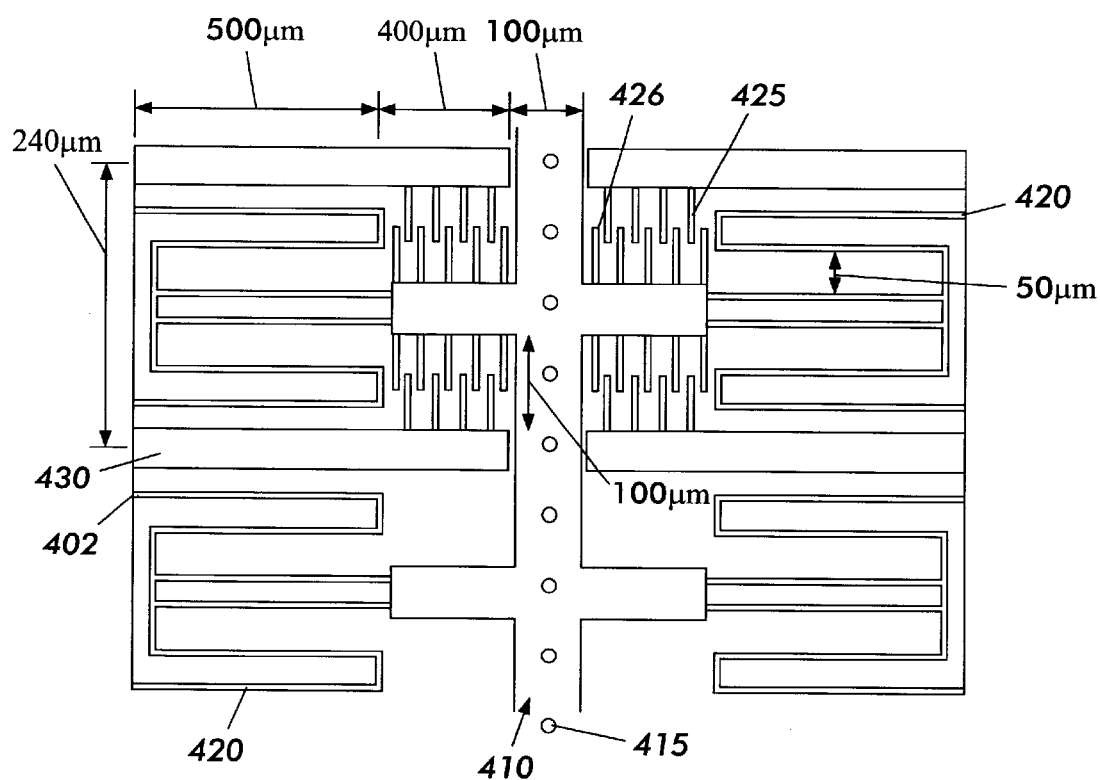
FIG. 24 shows a top view of a unit of the light emitting assembly array in FIG. 23.

FIG. 24 shows a unit cell of VCSEL shuttle 400 with folded mechanical beam 420. For the folded beam flexure shown in FIG. 24, the system spring constant $k_y$ for the unit cell is given by:

$$k_y = 8EHb^3/3L^3 \qquad (2)$$

where E is the Young's modulus of the material, L is the beam length, H is the beam thickness, b is the beam width. The maximum deflection of movable stage 410 supported by folded mechanical beam 420 is given by:

$$d_m = d(k_x/2k_y)^{1/2} \qquad (3)$$

where d is the gap between fingers and $k_x$ is a function of the deflection in the y direction, $\delta_y$, from the neutral position. With increased deflection of folded mechanical beam 420 from the neutral position, the spring constant, $k_x$, in the x direction decreases as $1/\delta_y^2$.

Maximum displacement of movable stage 410 is proportional to:

$$d_m \alpha (dLH/b)^{1/2} \qquad (4)$$

Equation (4) shows that the maximum deflection without sticking or finger touching is proportional to the thickness, H, of beam with a proportionality constant of approximately 1.08. Hence, the thicker the folded beam, the larger the maximum deflection will be for a given width, b, folded beam length L and comb drive fingers gap, d. Referring to FIG. 24, if folded beam 420 has a length, L, of 500 µm, a thickness, H, of 25 µm, and a width, b, of 7 µm and comb drive fingers gap, d, of 2 µm, the maximum displacement, $d_m$, is greater than 40 µm.

Increasing the thickness of folded beams 420 aids in preventing beam flexure and preventing shuttle 410 from buckling. Referring also to FIG. 2, slight lattice mismatch between AlGaAs layer 58 and GaAs substrate 56 in the structure of VCSELs 415 leads to compressive stress in AlGaAs layer 58 and promotes buckling of shuttle 410. The lattice constant of an AlGaAs lattice is slightly larger than the lattice constant of a GaAs lattice. As the thickness of GaAs buffer layer 60 (see FIGS. 2–8) increases, the buckling-free length of shuttle 410 will increase as well. Assuming that a deep etching technique is developed for GaAs material, it is possible to make shuttle 410 over 100 µm thick (such etching processes exist for silicon material). Fold mechanical beams 420 and shuttle 410 in FIG. 23 may also be strengthened by depositing a tensile strained dielectric film such as $SiN_x$ or $SiO_2$ to compensate for the built-in compressive strain. Typically, GaAs substrate 56 underneath beams 430 is not removed to increase the mechanical strength of beams 430 to which fixed fingers 425 are attached.

In order to electrically isolate fixed fingers 425 from movable fingers 426 and VCSELs 415, VCSELs 415 are grown on semi-insulating substrate 56 with 18 µm thick n-GaAs buffer layer 60 as shown in FIG. 2. VCSELs 415 are grown on top of n-GaAs buffer layer 60. Referring to FIG. 23, fixed fingers 425 are isolated from movable fingers 426 by isolation grooves 499. VCSELs 415 receive power from conductive pads 480. Contact lines (not shown) to VCSELs 415 from conductive pads 480 are laid out over the centers of folded mechanical beams 420 where stress due to bending is a minimum. Isolation grooves 499 are etched into semi-insulating substrate 56 shown in FIG. 2.

The driving voltage needed to displace VCSEL movable stage 410 supported by a folded beam flexure a distance of 30 µm is approximately 224 V in static (non-resonant) mode. The driving voltage, V, may be expressed as:

$$V = (d_m d k_y / n \epsilon_0 h)^{1/2} \qquad (5)$$

where n is the number of fingers for one drive direction, h is the width of the comb fingers, d is the gap spacing between fingers and $\epsilon_0$ is the dielectric constant in air. The driving voltage under resonance conditions is reduced to 22.4 V if the Q factor in air of movable stage 410 is 100. If narrower folded beams are used the driving voltage can be reduced further. The resonant frequency for movable stage 410 is calculated to be about 5.3 kHz.

Movable stage 410 needs to scan at least half of the pitch of VCSELs 415 to resolve all the pixels across a page width line. If VCSEL 415 pitch is 60 µm, then the maximum scan range of movable stage 410 has to exceed 30 µm. As discussed above, movable stage 410 in the configuration shown in FIG. 23 is capable of a displacement greater than 40 µm in either direction while maintaining linearity.

Figure 25:
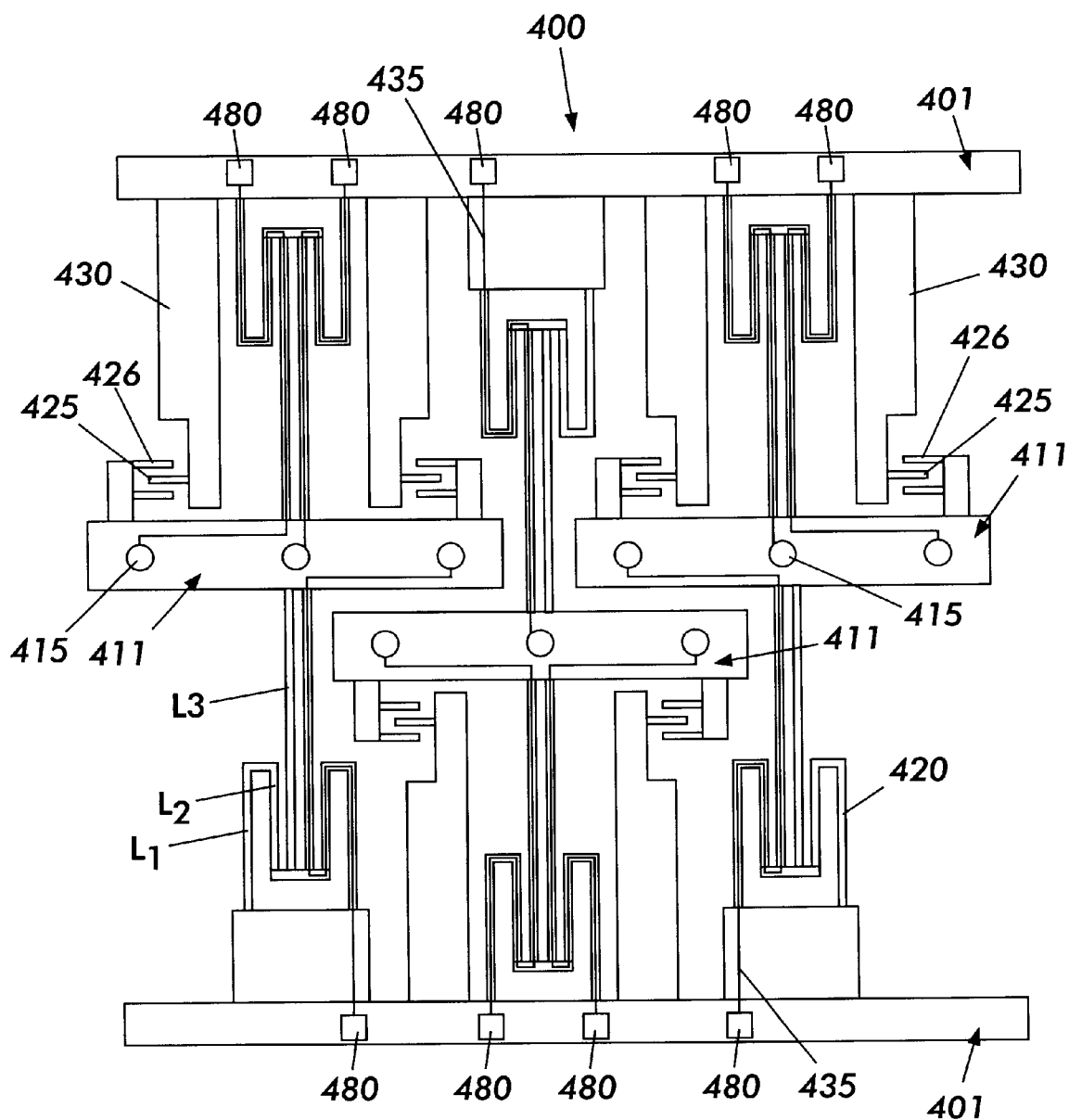
FIG. 25 shows a top view of staggered light emitting assembly arrays in accordance with an embodiment of this invention.

An alternative design for a scanning VCSEL shuttle is shown in FIG. 25. Multiple movable stages 411 are arranged in parallel so that VCSELs 415 are staggered. For the same VCSEL pitch as shown in FIG. 23 of 100µm, the required displacement of multiple movable stages 411 is only half that of the single movable stage 410 shown in FIG. 23 increasing reliability and reducing the driving voltage. With a 7× projection system, 435 VCSELs and 145 stages are needed to achieve results similar to that of the configuration shown in FIG. 23.

Electrical connections to VCSELs 415 are established via conductive lines 435 which run from contact pads 480 on substrate 401 to movable stages 411 as in FIG. 23. Conductive lines 435 run over and are electrically isolated from the neutral fiber of folded beams 420 to VCSELs 415. Return current from VCSELs 415 flows through folded beams 420. The 'neutral fiber' is the stress free centerline of folded beams 420. As noted above, conductive lines 435 are chosen sufficiently small relative to the width of folded beams 420 and run along the stress free centerlines of folded beams 420 to allow conductive lines 435 to survive the flexing of folded beams 420. The electrical isolation of conductive lines 435 from folded beams 420 may be accomplished in many ways, for example, with a dielectric layer underneath conductive lines 435 or insulating the surface of folded beams 420 using shallow ion implantation.

For the folded beam flexure shown in FIG. 25, the system spring constant $k_y$ is given by:

$$k_y = 4k_1 k_2 k_3 / [k_1 k_2 + k_3(k_1 + k_2)] \qquad (6)$$

where:

$$k_n = EHb^3/L_n^3 \quad n=1, 2, 3 \qquad (7)$$

with E, H, and b as defined above. $L_n$ is the length of the respective folded beam segments as shown in FIG. 25. Taking $L_2 \approx L_1 = L_3/2$ results in the expression for $k_y$:

$$k_y = 2EHb^3/5L_1^3 \qquad (8)$$

For the same length ratios, the system spring constant $k_x$ is given by:

$$k_x = EHb/L_1 \qquad (9)$$

Hence, for the folded beam structure shown in FIG. 25, with $L_1 = 250$ µm, the maximum deflection is about 79 µm before sticking. The resonant frequency of VCSEL shuttle 411 is calculated to be about 11 khz. 50 movable fingers 426 are used for the comb drives in each scan direction. For a beam width, b, of 7 µm, the static driving voltage, $V_s = 348$ V and assuming a Q of 100, the resonant driving voltage $V_r = 34.8$ V. If the beam width, b, is taken to be 5 µm, the static driving voltage, $V_s$, is reduced to 210 V and again assuming a Q of 100, the resonant driving voltage $V_s$=21 V.

As those skilled in the art will appreciate, other various modifications, extensions, and changes to the foregoing disclosed embodiments of the present invention are contemplated to be within the scope and spirit of the invention as defined in the following claims.

We claim:

1. A movable light emitting assembly comprising:
   a substrate comprising semiconductor material;
   a plurality of light sources, wherein each of said plurality of light sources is a VCSEL which is formed integrally with said substrate;
   a light source support which movably supports said plurality of light sources;
   a plurality of suspension members attached to said light source support and attached to said substrate thereby suspending said light source support, wherein each of said plurality of suspension members has an associated length such that each one of said plurality of suspension members may deflect to a value which is approximately ten percent of said associated length; and
   a force generator comprised of a pair of electrostatic combs made of a semiconductor material, each said pair of electrostatic combs having a fixed comb set attached to said substrate and a movable comb set attached to said light source support to actuate said light source support whereby said light source support is moved back and forth substantially parallel to said substrate.

2. The movable light emitting assembly of claim 1 wherein each of said plurality of flexible suspension members is a folded beam.

3. The movable light emitting assembly of claim 1 further comprising:
   a plurality of electrically conductive members, each of said plurality of electrically conductive members being attached at a first end to one of said plurality of light sources, respectively, and being attached at a second end to an electrode on said substrate.

4. The movable light emitting assembly of claim 3 wherein said each of said plurality of electrically conductive members is supported by said each of said plurality of suspension members, respectively.

5. The movable light emitting assembly of claim 1 wherein said substrate includes an undoped III–V layer.

6. A movable light emitting assembly comprising:
   a substrate comprising semiconductor material;
   a first light source;
   a second light source;
   a first light source support which movably supports said first light source;
   a second light source support which movably supports said second light source, said second light source support being positioned substantially parallel to said first light source support such that said first light source is not aligned with said second light source;
   a first and a second pair of suspension members, said first pair of suspension members each attached to said first light source support and to said substrate, said second pair of suspension members each attached to said second light source support and to said substrate, thereby suspending said first light source support and said second light source support; and
   a plurality of force generators which act to move said first light source support and said second light source support.

7. The movable light emitting assembly of claim 6 wherein said first pair of suspension members are a pair of folded beams.

8. The movable light emitting assembly of claim 6 further comprising:
   an electrically conductive member having a first end and a second end, said first end being attached to said first light source, said second end being attached to an electrode on said substrate.

9. The movable light emitting assembly of claim 8 werein said electrically conductive member is supported by one of said first pair of suspension members.

10. The movable light emitting assembly of claim 6 wherein each of said plurality of force generators is comprised of a pair of electrostatic combs, each said pair of electrostatic combs having a fixed comb set attached to said substrate and a movable comb set attached to said light source support.

11. The movable light emitting assembly of claim 6 wherein each of said plurality of force generators is made of a semiconductor material.

12. The movable light emitting assembly of claim 6 wherein said first light source is a VCSEL which is formed integrally with said substrate.

13. The movable light emitting assembly of claim 6 wherein each of said plurality of force generators is of a plate capacitor type.

14. The movable light emitting assembly of claim 6 wherein said substrate includes an undoped III–V layer.

15. The undoped III–V layer of claim 14 wherein said undoped III–V layer comprises Gallium Arsenide.

* * * * *